US012417896B2

(12) United States Patent
Iwasaki

(10) Patent No.: US 12,417,896 B2
(45) Date of Patent: Sep. 16, 2025

(54) MULTI-ELECTRON BEAM WRITING APPARATUS AND MULTI-ELECTRON BEAM WRITING METHOD

(71) Applicant: NuFlare Technology, Inc., Yokohama (JP)

(72) Inventor: Kota Iwasaki, Atsugi (JP)

(73) Assignee: NuFlare Technology, Inc., Yokohama (JP)

( * ) Notice: Subject to any disclaimer, the term of this patent is extended or adjusted under 35 U.S.C. 154(b) by 475 days.

(21) Appl. No.: 18/148,761

(22) Filed: Dec. 30, 2022

(65) Prior Publication Data

US 2023/0260748 A1    Aug. 17, 2023

(30) Foreign Application Priority Data

Feb. 17, 2022  (JP) ................................. 2022-023025

(51) Int. Cl.
  *H01J 37/317*  (2006.01)

(52) U.S. Cl.
  CPC ... *H01J 37/3177* (2013.01); *H01J 2237/0437* (2013.01); *H01J 2237/10* (2013.01); *H01J 2237/31764* (2013.01)

(58) Field of Classification Search
  CPC .......... H01J 37/22; H01J 37/28; H01J 37/065; H01J 37/061; H01J 37/073; H01J 37/3177;

(Continued)

(56) References Cited

U.S. PATENT DOCUMENTS 10,854,424 B2    12/2020   Furuyama
2016/0349625 A1  12/2016   Furuya et al.
(Continued)

FOREIGN PATENT DOCUMENTS

JP        2001-52996 A     2/2001
JP        2003-51 1855 A   3/2003
(Continued)

OTHER PUBLICATIONS

Combined Taiwanese Office Action and Search Report issued Oct. 19, 2023 in Taiwanese Patent Application No. 111147784 (with unedited computer-generated English Translation), 11 pages.

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

A multi-electron beam writing apparatus includes a light source array to include plural light sources and generate plural first lights, a multi-lens array to include plural first lenses, and to divide the plural first lights into plural second lights by that each of the plural first lights illuminates a corresponding lens set of plural lens sets each composed of plural second lenses being a portion of the plural first lenses and by that each of lenses, being at least a part of the plural second lenses, is irradiated with two or more first lights of the plural first lights, a photoemissive surface to receive the plural second lights through its upper surface, and emit multiple photoelectron beams from its back surface, and a blanking aperture array mechanism to perform an individual blanking control by individually switching between ON and OFF of each of the multiple photoelectron beams.

10 Claims, 18 Drawing Sheets

(58) Field of Classification Search
CPC .. H01J 37/3023; H01J 37/045; H01J 2237/10; H01J 2237/061; H01J 2237/083; H01J 2237/0437; H01J 2237/06333; H01J 2237/2817; H01J 2237/30472; H01J 2237/31764; H01J 2237/31779
See application file for complete search history.

(56) References Cited

U.S. PATENT DOCUMENTS

| | | |
|---|---|---|
| 2020/0279713 A1* | 9/2020 | Delgado .................. H01J 37/22 |
| 2020/0279717 A1* | 9/2020 | Furuyama ............ H01J 37/3177 |
| 2020/0381212 A1 | 12/2020 | Ren et al. |
| 2022/0059310 A1 | 2/2022 | Iwasaki et al. |
| 2022/0189734 A1 | 6/2022 | Yamada et al. |

FOREIGN PATENT DOCUMENTS

| | | |
|---|---|---|
| JP | 2004-93837 A | 3/2004 |
| JP | 2009-192789 A | 8/2009 |
| JP | 2020-145401 A | 9/2020 |
| JP | 2022-35477 A | 3/2022 |
| JP | 2022-94681 A | 6/2022 |
| KR | 10-2022-0002623 A | 1/2022 |
| WO | WO 01/26134 A1 | 4/2001 |

* cited by examiner

CONDITION A: SMALL INDIVIDUAL LENS AT CENTER OF SPOT

CONDITION B: SMALL INDIVIDUAL LENS BETWEEN SPOTS

CONDITION C: LARGE INDIVIDUAL LENS BETWEEN SPOTS

MULTI-ELECTRON BEAM WRITING APPARATUS AND MULTI-ELECTRON BEAM WRITING METHOD

CROSS-REFERENCE TO RELATED APPLICATION

This application is based upon and claims the benefit of priority from prior Japanese Patent Application No. 2022-023025 filed on Feb. 17, 2022 in Japan, the entire contents of which are incorporated herein by reference.

BACKGROUND OF THE INVENTION

Field of the Invention

Embodiments of the present invention relate to a multi-electron beam writing apparatus and a multi-electron beam writing method.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. Thus, the electron beam writing technique which intrinsically has excellent resolution is used for writing or "drawing" a mask pattern on a mask blank with electron beams.

For example, as a known example of employing the electron beam writing technique, there is a writing apparatus using multiple electron beams. Since it is possible for multi-beam writing to apply multiple electron beams at a time, the writing throughput can be greatly increased in comparison with single electron beam writing. For example, a writing apparatus employing the multiple electron beam system forms multiple beams by letting portions of an electron beam emitted from an electron gun individually pass through a corresponding one of a plurality of holes in a shaping aperture array substrate, performs blanking control for respective formed beams, reduces by an optical system each beam that was not blocked by a limiting aperture so as to reduce a mask image, and deflects the reduced beam by a deflector to irradiate a desired position on a target object or "sample".

As a formation technology for multiple electron beams, there is disclosed a method of forming multiple electron beams by irradiating the whole photoemissive surface with laser beams, and emitting electrons from a plurality of regions at the back side of the photoemissive surface (e.g., refer to Japanese Translation of PCT International Application Publication No. 2003-511855).

BRIEF SUMMARY OF THE INVENTION

According to one aspect of the present invention, a multi-electron beam writing apparatus includes a light source array configured to include a plurality of light sources and generate a plurality of first lights;

a multi-lens array configured to include a plurality of first lenses, and to divide the plurality of first lights into a plurality of second lights by that each of the plurality of first lights illuminates a corresponding lens set of a plurality of lens sets each of which are composed of a plurality of second lenses being a portion of the plurality of first lenses and by that each of lenses, which are at least a part of the plurality of second lenses, is irradiated with two or more first lights of the plurality of first lights;

a photoemissive surface configured to receive the plurality of second lights through its upper surface, and emit multiple photoelectron beams from its back surface;

a blanking aperture array mechanism configured to perform an individual blanking control by individually switching between ON and OFF of each of the multiple photoelectron beams; and an electron optical system configured to irradiate a target object with the multiple photoelectron beams.

According to another aspect of the present invention, a multi-electron beam writing method includes generating a plurality of first lights from a light source array which includes a plurality of light sources;

dividing, using a multi-lens array which includes a plurality of first lenses, the plurality of first lights into a plurality of second lights by that each of the plurality of first lights illuminates a corresponding lens set of a plurality of lens sets each of which are composed of a plurality of second lenses being a portion of the plurality of first lenses and by that each of lenses, which are at least a part of the plurality of second lenses, is irradiated with two or more first lights of the plurality of first lights;

receiving the plurality of second lights through an upper surface of a photoemissive surface, and emitting multiple photoelectron beams from a back surface of the photoemissive surface;

performing an individual blanking control, using a blanking aperture array mechanism, by individually switching between ON and OFF of each of the multiple photoelectron beams; and writing a pattern on a target object by using the multiple photoelectron beams.

DETAILED DESCRIPTION OF THE INVENTION

Although it is not publicly known, to use multiple electron beams emitted from a photoemissive surface for a writing apparatus has been examined. Alike the case of using other electron emission sources, it is requested to increase the throughput of writing processing even in the case of using multiple electron beams emitted from a photoemissive surface for a writing apparatus. Accordingly, it is needed to irradiate the photoemissive surface with high intensity beams. Therefore, irradiation of the photoemissive surface with not only a single light from one light source but also a plurality of lights from a plurality of light sources has been examined.

In order to control the intensity distribution of generated multiple electron beams to be uniform, it is necessary to make uniform (equal) the received light amount of each irradiated region of the photoemissive surface which generates electron beams. Meanwhile, with respect to lights from each light source, an intensity distribution exists therein. Generally, the intensity at the center portion is stronger than that at the periphery. Therefore, for making uniform the received light amount of each region which generates an electron beam, it is desired to arrange light sources so that the number of light sources and the number of electron beams may be ideally 1:1.

However, it may be difficult to arrange the light sources whose the number is the same that of multiple electron beams due to a problem of an arrangement space and/or a problem of an influence by heat generation of each light source, etc.

Embodiments hereafter describe an apparatus and method that can increase, in multi-electron beam writing, uniformity (equality) of the received light amount of each region of a photoemissive surface which generates electron beams.

First Embodiment

Figure 1:
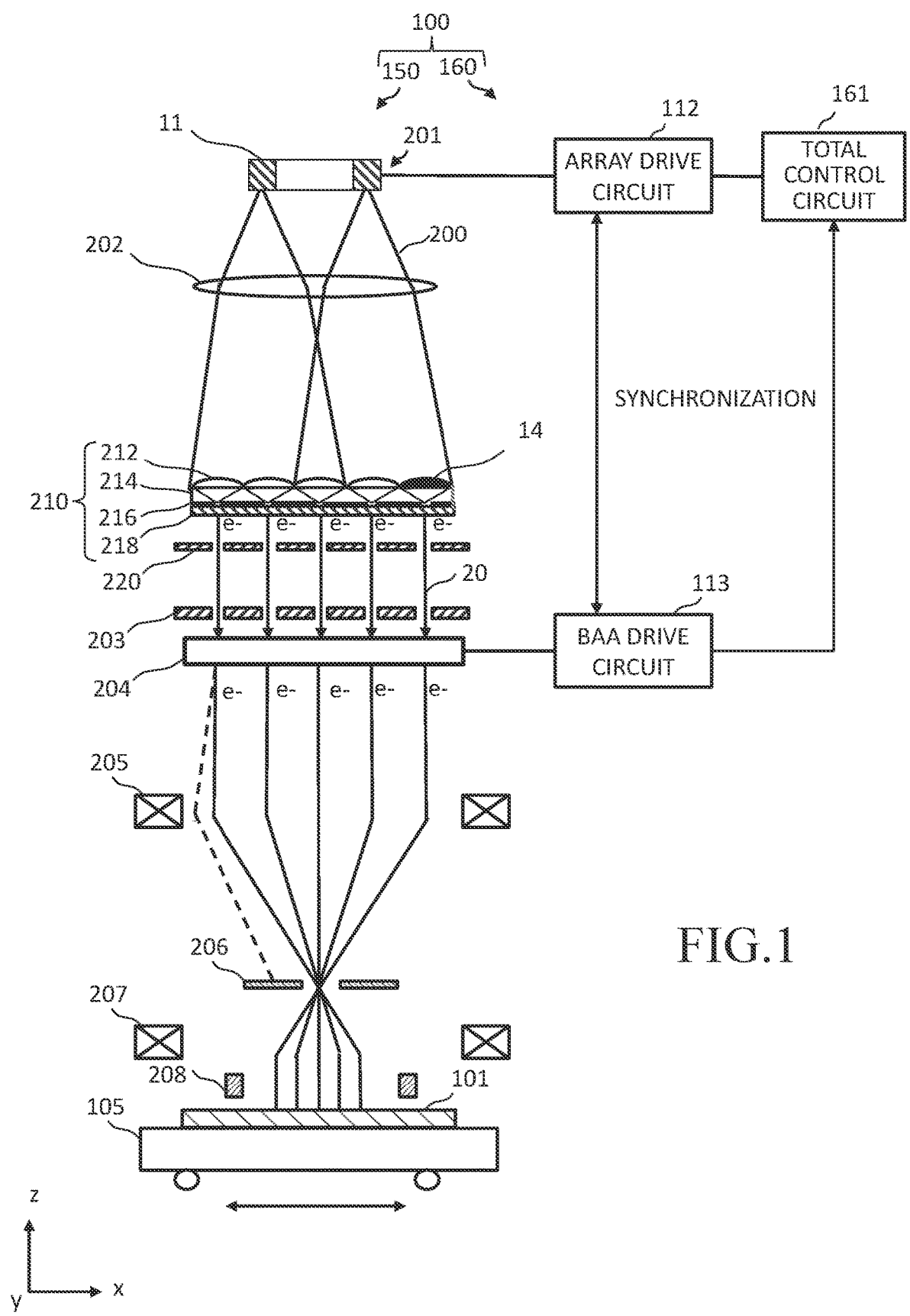
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control circuit system 160. The writing apparatus 100 is an example of a multi-charged particle beam writing apparatus. In the electron optical column (electron beam column) (not shown) inside the writing mechanism 150, there are arranged, in this order: a light source array 201, an illumination lens 202, a photoelectron emission mechanism 210, a multi-anode electrode 220, a shaping aperture array substrate 203, a blanking aperture array mechanism 204, an electron lens 205, a limiting aperture substrate 206, an electron lens 207 (objective lens), and an objective deflector 208. In the chamber (not shown) arranged below the electron optical column (not shown), an XY stage 105 is disposed. On the XY stage 105, there is placed a target object or "sample" 101 such as a resist-coated mask blank serving as a writing target substrate when writing is performed. The target object 101 is, for example, an exposure mask used when fabricating semiconductor devices, or a semiconductor substrate (silicon wafer). The insides of the electron optical column and the writing chamber, at the downstream side of the photoelectron emission mechanism 210, are evacuated by a vacuum pump (not shown) to be controlled in a pressure lower than the atmospheric pressure.

The light source array 201 includes a plurality of light sources 11. Each light source 11 emits an excitation light. Therefore, the light source array 201 emits a plurality of excitation lights. FIG. 1 shows the case where two light sources 11 are arranged in the x direction. Showing light sources arranged in the y direction is omitted. The number of the light sources 11 is not limited thereto. The light source array 201 is configured by an array of a plurality of light sources 11 whose number is less than that of multi-photoelectron beams described later. As each light source 11, a light emitting diode (LED), a laser diode, or a mercury lamp can be used, for example.

In the photoelectron emission mechanism 210, a multi-lens array 212 is disposed on a glass substrate 214. A multi-light shielding film 216 serving as a light shielding mask, and a photoemissive surface 218 (an example of a photoemitter) are disposed on the back side of the glass substrate 214. The glass substrate 214 and the multi-lens array 212 may be formed as an integrated body.

The control circuit system 160 includes an array drive circuit 112, a blanking aperture array (BAA) drive circuit 113, and a total control circuit 161. The array drive circuit 112, the blanking aperture array (BAA) drive circuit 113, and the total control circuit 161 are mutually connected through a bus (not shown).

FIG. 1 shows configuration elements necessary for describing the first embodiment. It should be understood that other configuration elements generally necessary for the writing apparatus 100 may also be included therein.

Next, operations of the writing mechanism 150 will be described. The array drive circuit 112 drives the light source array 201 under the control of the total control circuit 161 which controls the entire writing apparatus 100. The light source array 201 emits (generates) a plurality of excitation lights 200 (first light). Each excitation light 200 includes a continuous light or a pulsed light. The light source array 201 emits a plurality of ultraviolet lights as the plurality of excitation lights 200. As the excitation light 200, it is preferable to use an ultraviolet light or a visible light having a wavelength of, for example, about 190 to 400 nm, and also preferable to use a laser light having a wavelength of, for example, 266 nm.

The plurality of excitation lights 200 emitted from the light source array 201 are refracted by the illumination lens 202 so as to illuminate the multi-lens array 212. The illumination lens 202 may be omitted. The multi-lens array 212 divides the plurality of excitation lights 200 into more plurality of lights (second light). Thus, the number of the plurality of excitation lights 200 is different from that of the plurality of lights (second light). The multi-lens array 212 includes a plurality of individual lenses (first lenses).

The multi-lens array 212 divides the plurality of excitation lights 200 into further more plurality of lights (second light) by that each of the plurality of excitation lights 200 illuminates a corresponding lens set of a plurality of lens sets each of which is composed of a plurality of lenses (second lenses) being a portion of the plurality of individual lenses (first lenses) and by that each of lenses, which are at least a part of the plurality of individual lenses (second lenses), is irradiated with two or more excitation lights of the plurality of excitation lights 200. Specifically, the multi-lens array 212 is configured by a lens array where individual lenses whose number is greater than or equal to that of multiple photoelectron beams 20 are arrayed. For example, it is composed of 512×512 lenses. The multi-lens array 212 individually collects the divided plurality of lights, and aligns the focus position of each light with the height position on the photoemissive surface 218. Thus, the effective brightness (luminance) of each light can be enhanced by the light collection by the multi-lens array 212.

A plurality of openings are formed in the multi-light shielding film 216 so that the region of the irradiation spot of each of the plurality of lights (multiple lights) having been divided and collected may be exposed. The multi-light shielding film 216 may be omitted, and however, by using the multi-light shielding film 216, lights which passed through the glass substrate 214 without being collected by the multi-lens array 212 and/or scattered lights can be blocked by portions other than the openings. Preferably, a chromium (Cr) film, for example, is used as the multi-light shielding film 216.

Each of the lights having passed through the multi-light shielding film 216 is incident on the upper side of the photoemissive surface 218. The photoemissive surface 218 receives a plurality of lights incident through its upper surface, and emits the multiple photoelectron beams 20 from its back surface. For example, 512×512 arrayed photoelectron beams are emitted in the x and y directions. Specifically, the photoemissive surface 218 receives a plurality of lights at the front surface, and emits photoelectrons from respective positions on the back side corresponding to incident positions. The photoemissive surface 218 is preferably formed by a film whose main material is a platinum-based material, such as platinum (Pt) and ruthenium (Ru). It is further preferable, for example, that the back side (downstream side in FIG. 1) of the main film of Pt is coated with a carbon (C)-based material, for example. A film including alkali metal such as cesium (Cs), rubidium (Rb), and kalium (K) may also be preferable. If the upper side of the photoemissive surface 218 is irradiated with photons having energy greater than a work function of material of the photoemissive surface 218, photoelectrons are emitted from its back side. In order to acquire the multiple photoelectron beams 20 of sufficient current density to be used in the writing apparatus 100, it is preferable that a light of, for example, about 0.1 to 100000 W/cm$^2$ (about 103 to 109 W/m2) is incident on the upper side of the photoemissive surface 218.

The multiple photoelectron beams 20 emitted from the photoemissive surface 218 are accelerated by being applied with a relatively positive electric potential and being drawn by the multi-anode electrode 220 in which openings are arranged at the same pitch as that of irradiation spots of the multi-lens array 212, and then proceed toward the shaping aperture array substrate.

Figure 2:
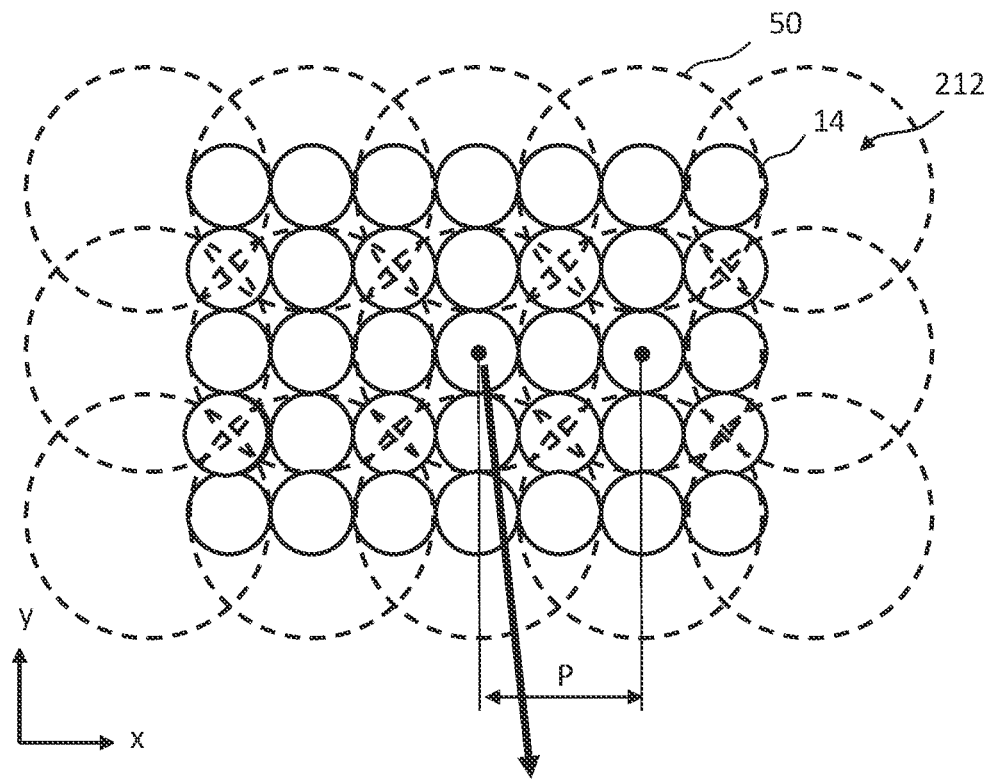
FIG. 2 is an illustration showing an example of irradiation positions of a plurality of excitation lights irradiating a multi-lens array according to the first embodiment.
Figure 3:
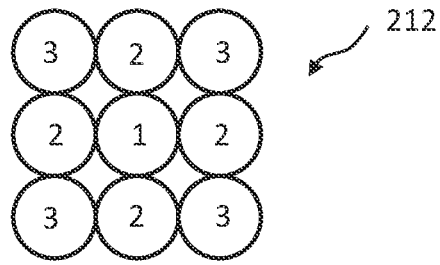
FIG. 3 is an illustration showing an example of an intensity distribution of an excitation light according to the first embodiment.
Figure 3:
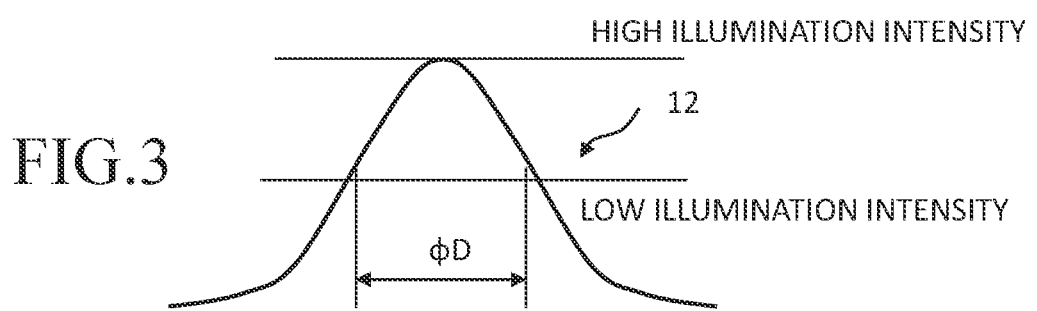

FIG. 2 is an illustration showing an example of irradiation positions of a plurality of excitation lights 50 irradiating a multi-lens array according to the first embodiment. FIG. 3 is an illustration showing an example of an intensity distribution of the excitation light 50 according to the first embodiment. The example of FIG. 2 shows 7×5 ones of a plurality of individual lenses 14 configuring the multi-lens array 212. The plurality of individual lenses 14 are arranged in an array. As shown in FIG. 3, an intensity distribution 12 exists in each excitation light 50. As shown in FIG. 3, the intensity in the central part is high, and it decreases toward the periphery. FIG. 3 shows the case where, in the intensity distribution, the beam width (half-value width) at the position of half the value obtained subtracting the minimum intensity from the maximum one is defined as a spot diameter φD. The example of FIG. 2 shows each excitation light 50 of the spot diameter φD at the incident surface of the multi-lens array 212. In the example of FIG. 2, a plurality of excitation lights 50 are arrayed in a square lattice, which can be obtained, for example, by arranging respective light sources of the light source array 201 in a square lattice.

Each of the plurality of excitation lights 50 from the light source array 201 individually illuminates a corresponding lens set of a plurality of lens sets each of which are composed of a plurality of individual lenses 14 being a portion of the plurality of individual lenses 14 configuring the multi-lens array 212. Further, each of individual lenses, which are at least a part of the plurality of individual lenses 14 configuring the multi-lens array 212 is irradiated with two or more excitation lights 50. In the example of FIG. 2, the plurality of excitation lights 50 illuminates the multi-lens array 212, for example, at a pitch P being twice the arrangement pitch between individual lenses 14. Each excitation light 50 illuminates a plurality of individual lenses 14, centering on the individual lens 14 being the center of 3×3 individual lenses 14, for example. FIG. 2 shows the case where, within the spot diameter of each excitation light 50, there are included the whole of the center individual lens 14 (lens 1), the whole of two individual lenses 14 (lens 2) adjacent in the x and −x directions to the central individual lens 14, the whole of two individual lenses 14 (lens 2) adjacent in the y and −y directions to the central individual lens 14, and a part of four individual lenses 14 (lens 3) oblique to the central individual lens 14. Since the individual lens 14 (lens 1) located at the center of the irradiation position of each excitation light 50 is irradiated with the maximum intensity light, its received light amount is large. In contrast, the intensity of an excitation light irradiating peripheral individual lenses 14 is low compared with that at the center. Therefore, the received light amount of peripheral individual lenses 14 received from one excitation light is small.

Thus, according to the first embodiment, each of peripheral individual lenses 14 is irradiated with two or more excitation lights 50. In the case of FIG. 2, each of the two individual lenses 14 (lens 2) adjacent in the x and −x directions and the two individual lenses 14 (lens 2) adjacent in the y and −y directions to the central individual lens 14 (lens 1) is ovelappingly irradiated with two excitation lights. Each of the four individual lenses 14 (lens 3) oblique to the central individual lens 14 (lens 1) is overlappingly irradiated with four excitation lights. That is, in a plurality of individual lenses 14, each of individual lenses 14 each of which is to be irradiated with the intensity of the central part is irradiated by one excitation light 50, and the other ones are irradiated by two or more excitation lights 50. The whole of the four individual lenses 14 (lens 2) adjacent in the x and −x directions and the y and −y directions to the central individual lens are irradiated with excitation lights each having a low illumination intensity. Therefore, by being irradiated with two excitation lights each having a low illumination intensity, the illumination intensity of the four individual lenses 14 can be substantially the same as or close to the received light amount of the center individual lens 14 (lens 1). With respect to the four individual lenses 14 (lens 3) in the oblique directions, since only a portion of them is included in the spot diameter of each excitation light 50, the illumination intensity of them can be substantially the same as or close to the received light amount of the center individual lens 14 (lens 1) by being irradiated with four excitation lights.

Thus, the received light amount of the individual lens 14 (lens 1) located at the center and that of the individual lenses 14 (lens 2) (lens 3) located at the periphery can be substantially (and approximately?) equal to each other.

Figure 4:
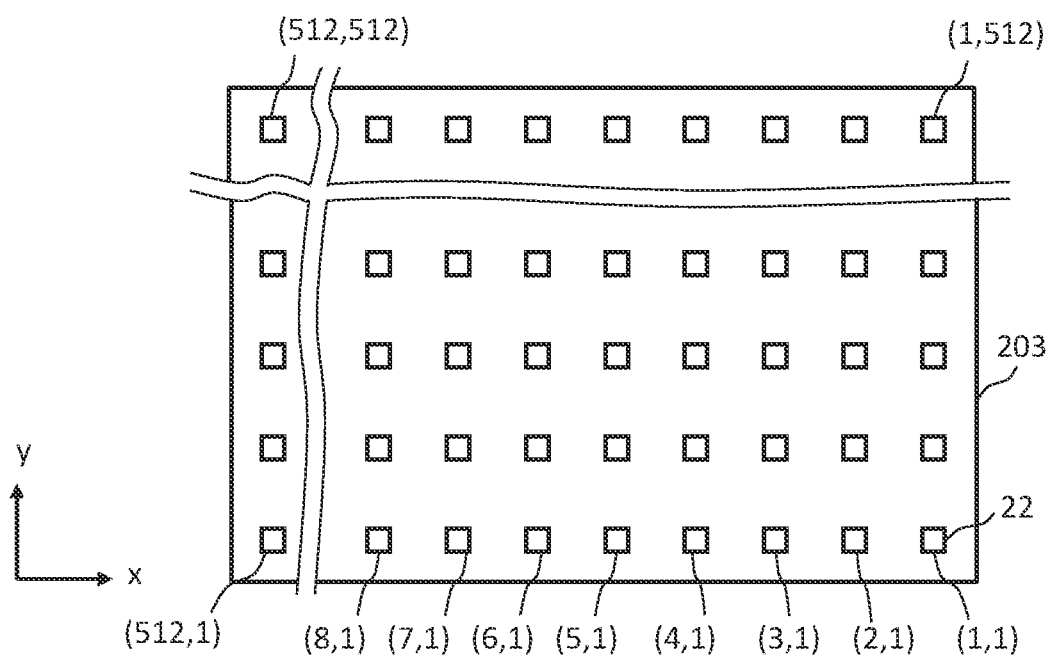
FIG. 4 is a conceptual diagram showing a configuration of a shaping aperture array substrates according to the first embodiment.

FIG. 4 is a conceptual diagram showing a configuration of a shaping aperture array substrates according to the first embodiment. As shown in FIG. 4. holes (openings) 22 of p rows long and q columns wide (p≥2, q≥2) are formed in the x and y directions, like a matrix, at a predetermined arrangement pitch in the shaping aperture array substrate 203. In the case of FIG. 4, for example, holes 22 of 512 (rows)×512 (columns) are formed in the x and y directions. Each of the plurality of holes 22 is formed to be individually on each of the trajectories of the multiple photoelectron beams 20 emitted from the photoemissive surface 218. Each photoelectron beam is not necessarily emitted in a uniform shape and size from the photoemissive surface 218. For example, in some cases, it expands in the diffusion direction. Therefore, the shape and size of each photoelectron beam is shaped by the shaping aperture array substrate 203. In FIG. 4, each of the holes 22 is rectangular, including square, having the same dimension and shape as each other. Alternatively, each of the holes 22 may be a circle with the same diameter as each other. The shaping aperture array substrate 203 forms the multiple photoelectron beams 20 to be used for writing. Specifically, the multiple photoelectron beams 20 are shaped in a desired shape and size by letting portions of emitted multiple photoelectron beams individually pass through a corresponding one of the plurality of holes. If diffusion of each photoelectron beam emitted from the photoemissive surface 218 is small, the shaping aperture array substrate 203 may be omitted.

Figure 5:
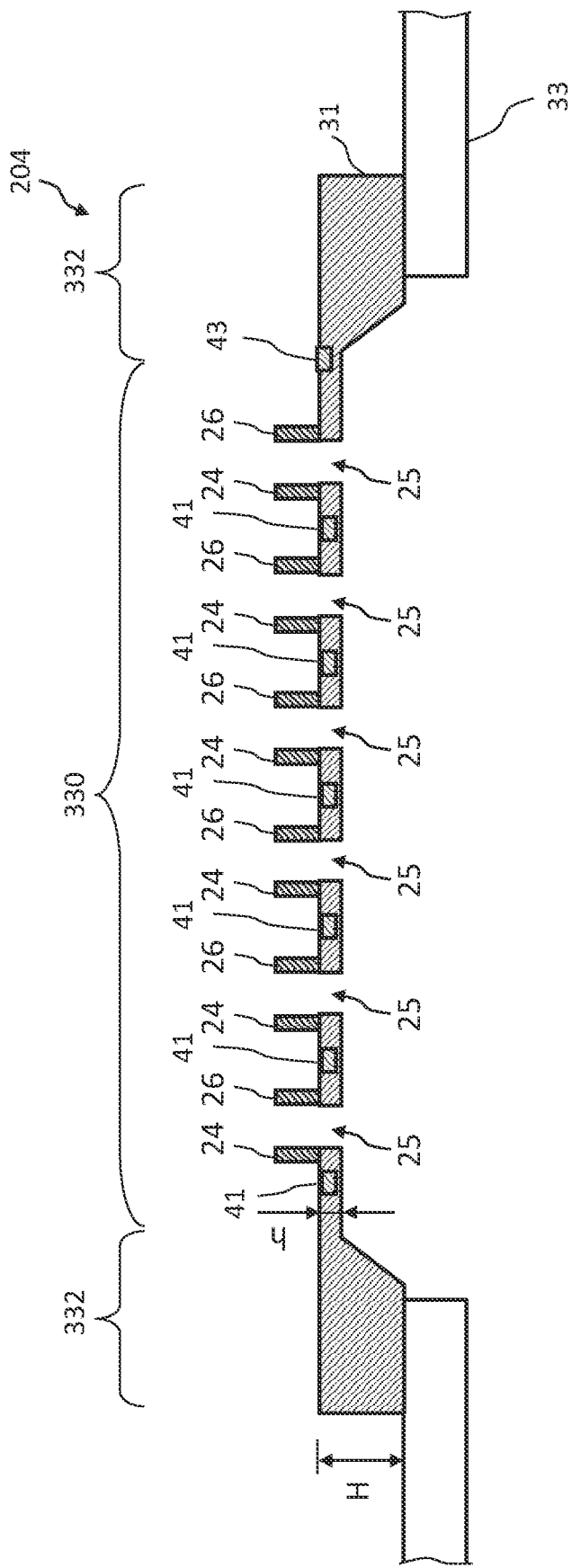
FIG. 5 is a sectional view showing a configuration of a blanking aperture array mechanism according to the first embodiment.

FIG. 5 is a sectional view showing a configuration of a blanking aperture array mechanism according to the first embodiment. With regard to the structure of the blanking aperture array mechanism 204, a semiconductor substrate 31 made of silicon, etc. is placed on a support table 33 as shown in FIG. 5. The central part of the substrate 31 is shaved, for example, from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple photoelectron beams 20 passes are formed at positions each corresponding to each hole 22 in the shaping aperture array substrate 203 shown in FIG. 4. In other words, in the membrane region 330 of the substrate 31, there are formed a plurality of passage holes 25 in an array through each of which a corresponding one of the multiple photoelectron beams 20 passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIG. 5, each pair (blanker: blanking deflector) of a control electrode 24 and a counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 of the substrate 31, there is arranged a logic circuit 41 which applies a deflection voltage to the control electrode 24 for the passage hole 25 concerned. The counter electrode 26 for each beam is grounded.

To each logic circuit 41, n-bit (e.g., 10-bit) parallel lines for control signals are connected. In addition to the n-bit parallel lines for controlling signals, lines for a clock signal, a read signal, a shot signal, a power supply, and the like are connected to each logic circuit 41. An individual blanking control mechanism composed of the control electrode 24, the counter electrode 26, and the logic circuit 41 is configured for each of the multiple beams. A plurality of logic circuits 41 formed in an array in the membrane region 330 are grouped, for example, per row or per column, and the logic circuits 41 in each group are connected in series. Then, a pad 43 arranged for each group sends a signal to the logic circuits 41 in the group concerned. Specifically, a shift register (not shown) is arranged in each logic circuit 41, and shift registers in the logic circuits 41 for beams in the same row, for example, in p×q, for example, multiple beams are connected in series. For example, control signals for beams in the same row in the p×q multiple beams are transmitted in series, and, a control signal for each beam is stored in a corresponding logic circuit 41 by p clock signals totally, for example.

In the logic circuit 41, an amplifier (not shown) (an example of a switching circuit) is arranged. The amplifier is connected to a positive potential (Vdd: blanking potential: first electric potential) (e.g., 5 V) and to a ground potential (GND: second electric potential). The output line (OUT) of the amplifier is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that each control electrode 24 and the corresponding counter electrode 26 are opposite to each other with respect to a corresponding one of a plurality of passage holes 25.

In a state where an L electric potential is applied to the input (IN) of the amplifier, the output (OUT) of the amplifier becomes a positive potential (Vdd), and then, a corresponding beam is deflected by an electric field due to a potential difference from the ground potential of the counter electrode 26 so as to be blocked by the limiting aperture substrate 206, and thus it is controlled to be in a beam OFF condition. By contrast, in a state (active state) where an H electric potential is applied to the input (IN) of the amplifier, the output (OUT) of the amplifier becomes a ground potential, and therefore, since there is no potential difference from the ground potential of the counter electrode 26, a corresponding beam is not deflected, and thus, by making the beam concerned pass through the limiting aperture substrate 206, it is controlled to be in a beam ON condition.

The blanking aperture array mechanism 204 performs individual blanking control by deflecting each beam of the multiple photoelectron beams 20 in order to individually switch each beam between ON and OFF states. In individual blanking control, each of the multiple photoelectron beams 20 passing through a corresponding passage hole is deflected by a voltage independently applied to a pair of the control electrode 24 and the counter electrode 26. Blanking control is provided by this deflection. Specifically, a pair of the control electrode 24 and the counter electrode 26 individually provides blanking deflection of a corresponding beam of the multiple photoelectron beams 20 by an electric potential switchable by the amplifier serving as a switching circuit corresponding to each pair. Thus, each of a plurality of blankers provides blanking deflection of a corresponding one of the multiple photoelectron beams 20 having passed through a plurality of holes 22 (openings) in the shaping aperture array substrate 203.

The multiple photoelectron beams 20 having passed through the blanking aperture array mechanism 204 are reduced by the electron lens 205, and go toward the hole in the center of the limiting aperture substrate 206 disposed close to a crossover position. An electron beam in the multiple photoelectron beams 20 which was deflected by the blanker of the blanking aperture array mechanism 204 deviates (shifts) from the hole in the center of the limiting aperture substrate 206, and is blocked by the limiting aperture substrate 206 (that is, beam OFF). On the other hand, an electron beam which was not deflected by the blanker of the blanking aperture array mechanism 204 passes through the hole in the center of the limiting aperture substrate 206 as shown in FIG. 1 (that is, beam ON). Blanking control is provided by ON/OFF of the individual blanking control mechanism, and thus ON/OFF of each beam is controlled. Thereby, for each beam, one shot beam is formed by a beam which has been made during a period from becoming beam ON to becoming beam OFF and has passed through the limiting aperture substrate 206. The target object 101 is irradiated with the multiple photoelectron beams 20 having been controlled to be in a "beam ON" state by the electron optical system. Specifically, the multiple photoelectron beams 20 having passed through the limiting aperture substrate 206 are focused by the electron lens 207 (objective lens) so as to be a pattern image of a desired reduction ratio. Then, all of the multiple photoelectron beams 20 controlled in a "beam ON" state are collectively deflected in the same direction by the objective deflector 208 to irradiate respective beam irradiation positions on the target object 101. Ideally, the multiple photoelectron beams 20 irradiating at a time are aligned at the pitch obtained by multiplying the arrangement pitch of a plurality of holes 22 in the shaping aperture array substrate 203 by the desired reduction ratio described above. The electron lens 205 and the electron lens 207 may be either an electrostatic lens or an electromagnetic lens.

Figure 6:
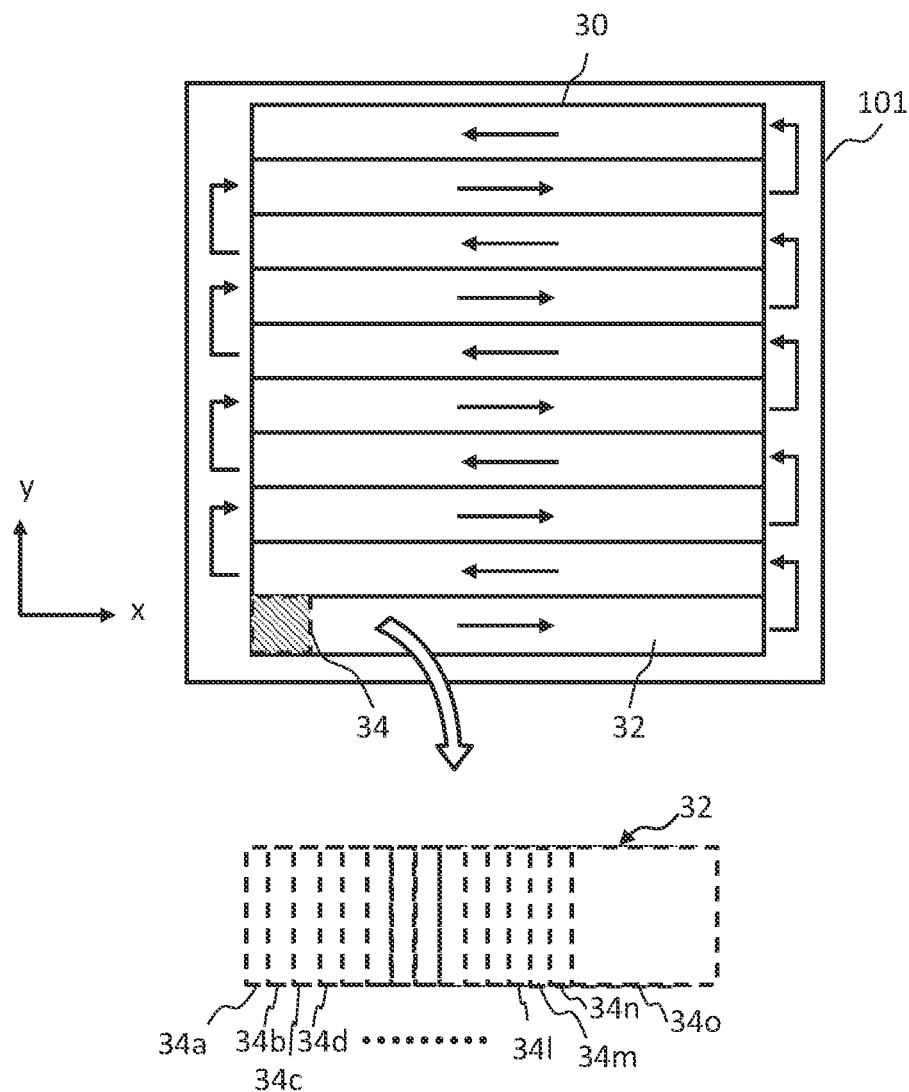
FIG. 6 is a conceptual diagram illustrating an example of a writing operation according to the first embodiment.

FIG. 6 is a conceptual diagram illustrating an example of a writing operation according to the first embodiment. As shown in FIG. 6, a writing region 30 of the target object 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple photoelectron beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203.

Figure 7:
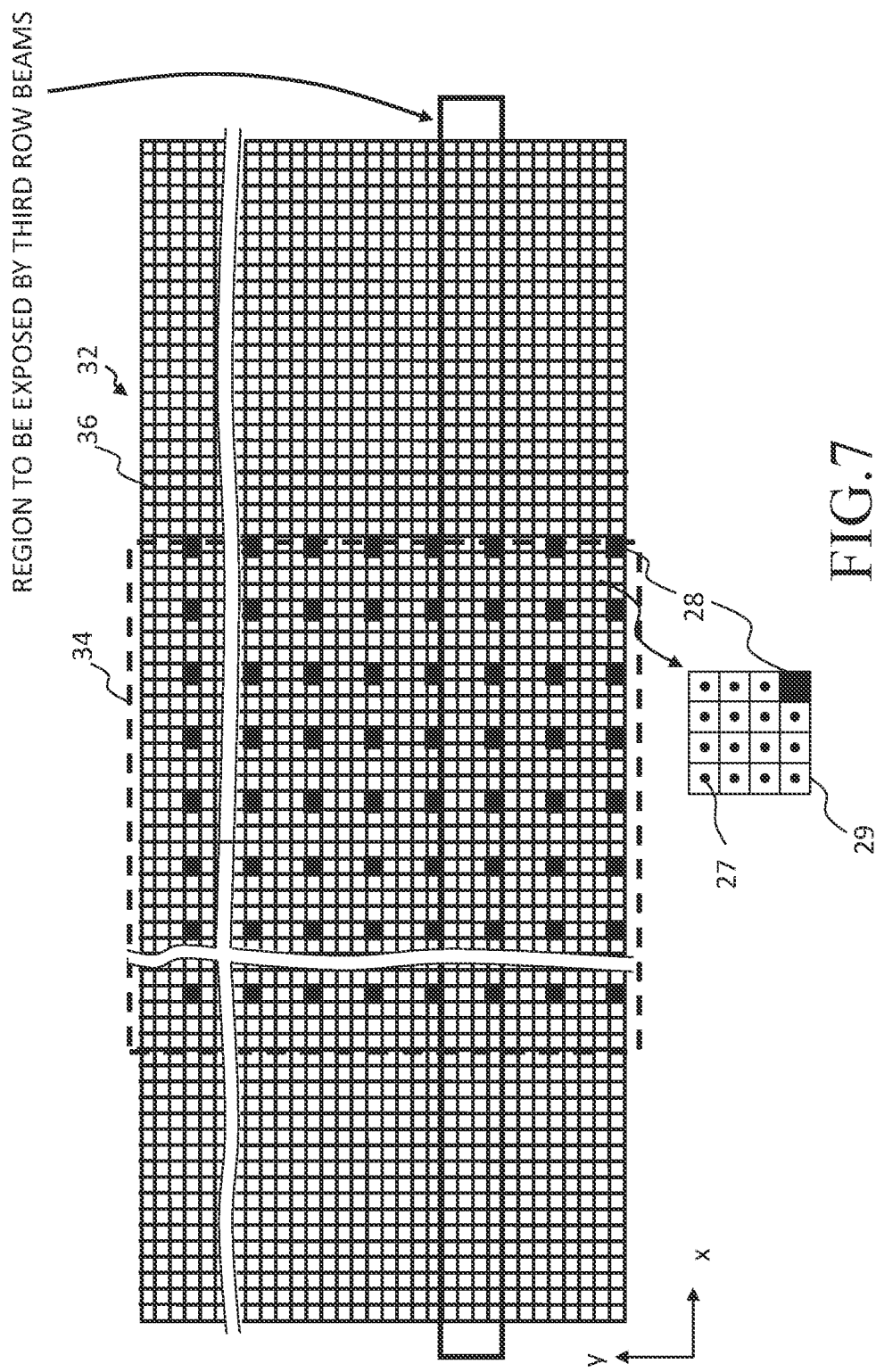
FIG. 7 is an illustration showing an example of an irradiation region of multiple beams and a writing target pixel according to the first embodiment.

FIG. 7 is an illustration showing an example of an irradiation region of multiple beams and a pixel to be written (writing target pixel) according to the first embodiment. In FIG. 7, in the stripe region 32, there are set a plurality of control grids 27 (design grids) arranged in a grid form at the pitch between beams of the multiple photoelectron beams 20 on the surface of the target object 101, for example. Preferably, they are arranged at a pitch of around 10 nm. The plurality of control grids 27 serve as design irradiation positions of the multiple photoelectron beams 20. The arrangement pitch of the control grid 27 is not limited to the beam size, and may be an arbitrary size which can be controlled as a deflection position of the objective deflector 208, regardless of the beam size. Then, a plurality of pixels 36 obtained by virtually dividing into a mesh form by the same size as that of the arrangement pitch of the control grid 27 are set, each of which is centering on each control grid 27. Each pixel 36 serves as an irradiation unit region per beam of the multiple photoelectron beams 20. FIG. 7 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple photoelectron beams 20. The x-direction size of the irradiation region 34 can be defined by the value obtained by multiplying the beam pitch (pitch between beams) in the x direction (first direction) of the multiple photoelectron beams 20 by the number of beams in the x direction. The y-direction size of the irradiation region 34 can be defined by the value obtained by multiplying the beam pitch in the y direction (second direction) of the multiple photoelectron beams 20 by the number of beams in the y direction. The width of the stripe region 32 is not limited to this. Preferably, the width of the stripe region 32 is n times (n being an integer of one or more) the size of the irradiation region 34. FIG. 7 shows the case where the multiple photoelectron beams 20 of 512×512 (rows×columns) are simplified to 8×8 (rows×columns). In the irradiation region 34, there are shown a plurality of pixels 28 (beam writing positions) which can be irradiated with one shot of the multiple photoelectron beams 20. In other words, the pitch between adjacent pixels 28 is the pitch between beams of the design multiple beams. In the example of FIG. 7, one sub-irradiation region 29 is a region surrounded by beam pitches. In the case of FIG. 7, each sub-irradiation region 29 is composed of 4×4 pixels.

Figure 8:
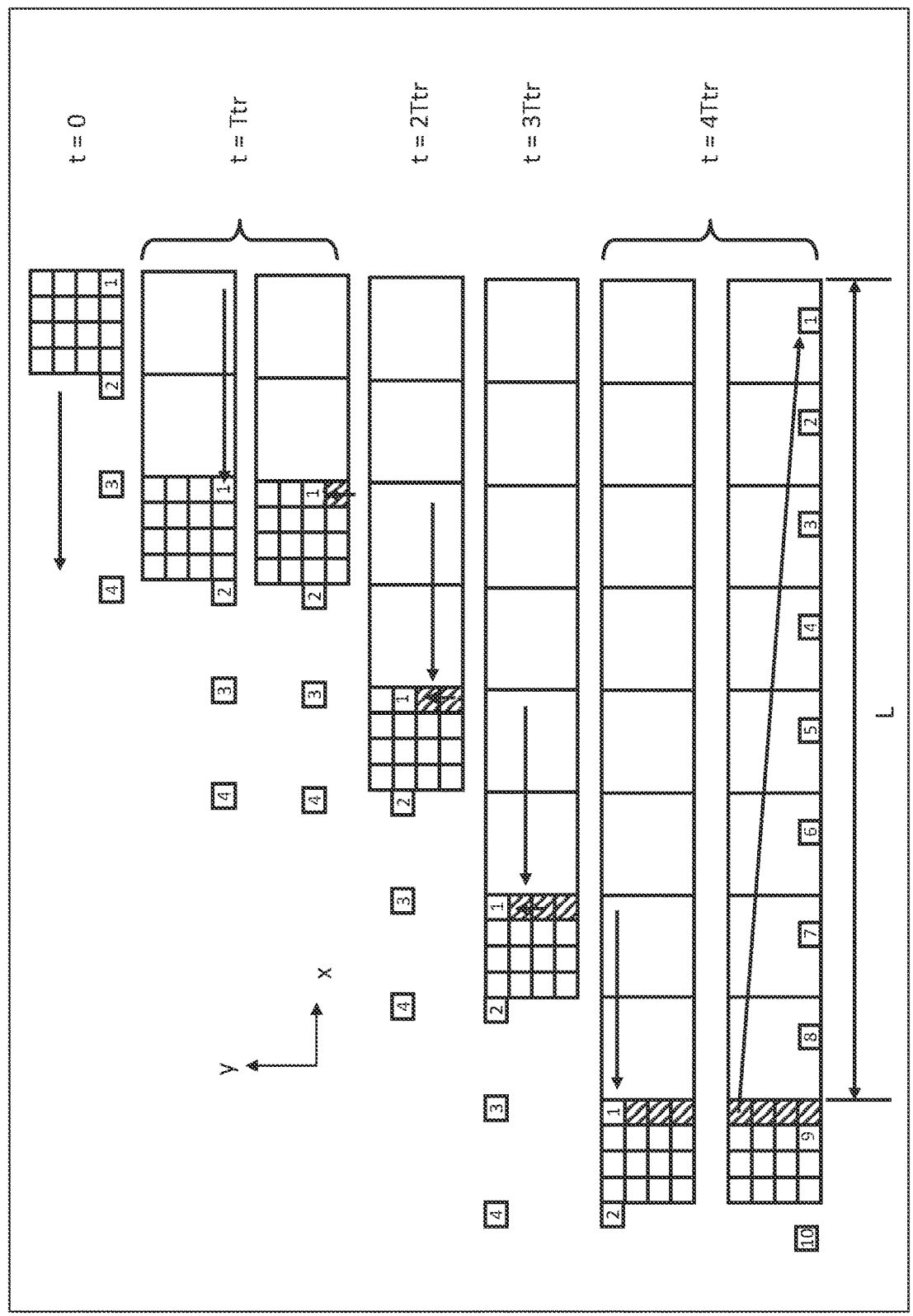
FIG. 8 is an illustration for explaining an example of a writing method of multiple beams according to the first embodiment.

FIG. 8 is an illustration for explaining an example of a writing method of multiple beams according to the first embodiment. FIG. 8 shows a portion of the sub-irradiation region 29 to be written by each beam. In the case of FIG. 8, while the XY stage 105 moves the distance of eight beam pitches, four pixels are written (exposed). At each shot, each pixel is irradiated with beams during a desired irradiation time controlled to be between 0 and the maximum irradiation time Ttr. The four pixels are written (exposed) during the time between t=0 and t=4Ttr. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple photoelectron beams 29 by the objective deflector 208. In other words, tracking control is performed. In the case of FIG. 8, one tracking cycle is executed by writing (exposing) four pixels while the target object 101 on the XY stage 105 moves the distance of eight beam pitches. After the four pixels have been irradiated with beams, the tracking position is returned to the start position of tracking, where the tracking control was started, by resetting the beam deflection for tracking control. In the example of FIG. 8, when the time becomes t=4Ttr, tracking of the sub-irradiation region 29 concerned is removed (cancelled), and the beam is swung back to a next target sub-irradiation region 29 shifted by eight beam pitches in the x direction. Although the beam (1) at the coordinates (1, 3) has been described in the example of FIG. 8, writing is also similarly performed for each sub-irradiation region 29 corresponding to a beam at other coordinates.

Since writing of the pixels in the first column from the right of each sub-irradiation region 29 has been completed, the deflector 209 performs, after resetting the tracking, in a next tracking cycle, deflection such that the writing position of each corresponding beam is adjusted (shifted) to the control grid 27 at the bottom in the second pixel column from the right of each sub-irradiation region 29. Thereby, by repetition of this operation, all of the pixels in each sub-irradiation region 29 are irradiated. By repeating this operation during writing the stripe region 32, the position of the irradiation region 34 is shifted one by one, such as from 34a to 34o as shown in FIG. 6, to perform writing of the stripe region concerned. In the case of FIG. 8, the sub-irradiation region 29 is composed of 4×4 pixels, but it is not limited thereto. When the sub-irradiation region 29 is composed of n×n pixels, n control grids (n pixels) are written by one tracking operation while the irradiation position is shifted. Thus, writing is performed for each n pixels by a different beam each time in n-time tracking operations, thereby writing all of pixels in one region of n×n pixels.

In multi-beam writing, the amount of dose of each beam is controlled based on an irradiation time. The irradiation time of each beam is controlled by the blanking aperture array mechanism 204. However, even when controlled to be in a "beam OFF" state by the blanking aperture array mechanism 204, blocking by the limiting aperture substrate 206 cannot be achieved completely, which may generate a leaking beam. If a leaking beam is generated, the resist on the target object 101 is exposed to light, thereby causing a problem of affecting the writing accuracy. Therefore, it is required to suppress or reduce leaking beams. With respect to, for example, a thermal cathode electron gun conventionally used as an electron beam source, it is difficult to turn on and off the emission (generation) of a beam of thermoelectrons during writing processing. Therefore, even when controlled to be in a "beam OFF" state by the blanking aperture array mechanism 204, as long as electron beams are emitted from the electron gun, leaking beams are continuously generated. Then, according to the first embodiment, the light source array 201 which can rapidly respond to ON/OFF, and the photoemissive surface 218 which emits a photoelectron responsive to an incident excitation light are used instead of the electron gun.

The control circuit system 160 interlocks, for each shot of the multiple photoelectron beams 20, the timing of switching between emission and stop of excitation lights with the timing of switching between ON and OFF of each beam. Specifically, as shown in FIG. 1, the control circuit system 160 is configured to interlock the array drive circuit 112 driving the light source array 201 and the BAA drive circuit 113 controlling the blanking aperture array mechanism 204. At least one control circuit of the array drive circuit 112, the BAA drive circuit 113, and the total control circuit 161 performs control to interlock the array drive circuit 112 with the BAA drive circuit 113. For example, the total control circuit 161 provides a control to interlock the array drive circuit 112 with the BAA drive circuit 113. Alternatively, the array drive circuit 112 may provide a control to interlock itself with the BAA drive circuit 113. Alternatively, the BAA drive circuit 113 may provide a control to interlock itself with the array drive circuit 112. What may be needed is to install a synchronous circuit which includes an oscillator to generate a clock signal for synchronization in any one of the array drive circuit 112, the BAA drive circuit 113, and the total control circuit 161. Specific contents of controlling are described below.

Figure 9:
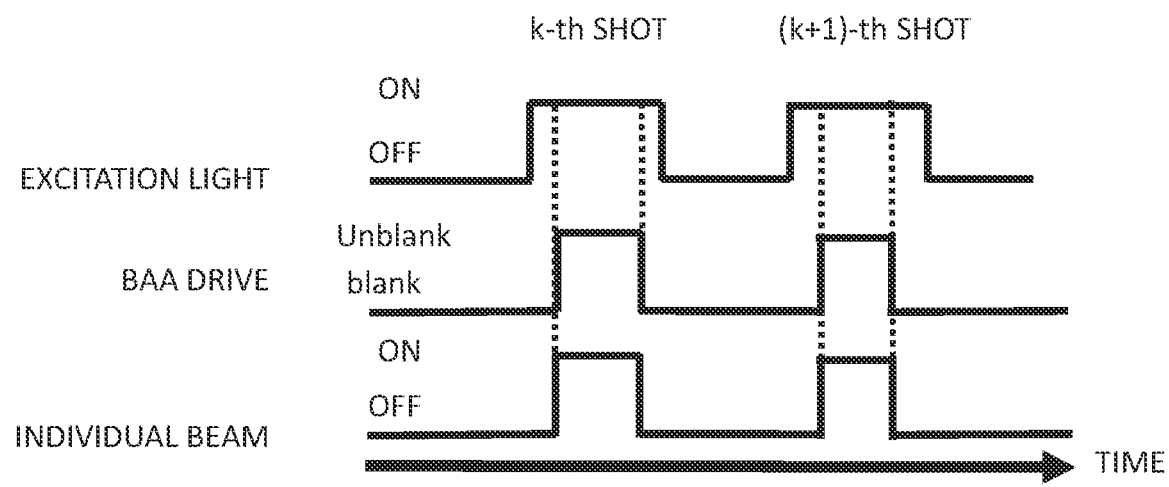
FIG. 9 is a time chart showing an example of a timing of switching between emission and stop of an excitation light, and a timing of switching between ON and OFF of a beam according to the first embodiment.

FIG. 9 is a time chart, according to the first embodiment, showing an example of a timing of switching between emission and stop of an excitation light, and a timing of switching between ON and OFF of a beam. FIG. 9 shows a timing chart of ON/OFF indicating emission/stop of an excitation light, a timing chart of an ON/OFF drive in individual blanking controlling of a beam in the blanking aperture array mechanism 204, and a timing chart of ON/OFF of a beam associated with an individual blanking control. FIG. 9 shows the k-th shot and the (k+1)-th shot of the multiple photoelectron beams 20.

In FIG. 9, for each shot of the multiple photoelectron beams 20, the control circuit system 160 provides a control to switch each beam which is due to be ON to a "beam ON" state from a "beam OFF" state at or after switching the excitation light 200 from a stop (OFF) state to an emission (ON) state. Then, the control circuit system 160 provides a control to switch the excitation light 200 to a stop state from an emission state when or after all the beams have become in the state of "OFF". In the shot cycle of the multiple photoelectron beams 20, as described above, an arbitrary irradiation time within a preset maximum irradiation time Ttr is set for each beam.

The light source array 201 starts emitting (generating) the excitation light 200 at a shot cycle start timing. The individual blanking control mechanism of each beam in the blanking aperture array mechanism 204 switches each beam which is due to be ON to a "beam ON" state from a "beam OFF" state at or after the time of shot cycle starting. The individual blanking control mechanism of each beam switches a beam to a "beam OFF" state from the "beam ON" state after an irradiation time individually set has passed. Thus, in accordance with operations of the individual blanking control mechanism, each beam is switched from a "beam OFF" state to a "beam ON" state, and after an irradiation time individually set has passed, it is switched from the "beam ON" state to a "beam OFF" state. The light source array 201 stops emitting each excitation light 200 after a predetermined time greater than or equal to the maximum irradiation time Ttr has passed since the shot cycle start timing. By this operation, even when a leaking beam through the limiting aperture 206 is generated in any one of the multiple photoelectron beams 20, since no photoelectron is generated in the first place while the excitation light 200 is being stopped, it is possible to avoid generating a leaking beam. For example, if the ON-and-OFF ratio of the excitation light 200 is 1:1, leaking beams can be reduced to 50% or less compared to the case of "always ON".

Figure 10:
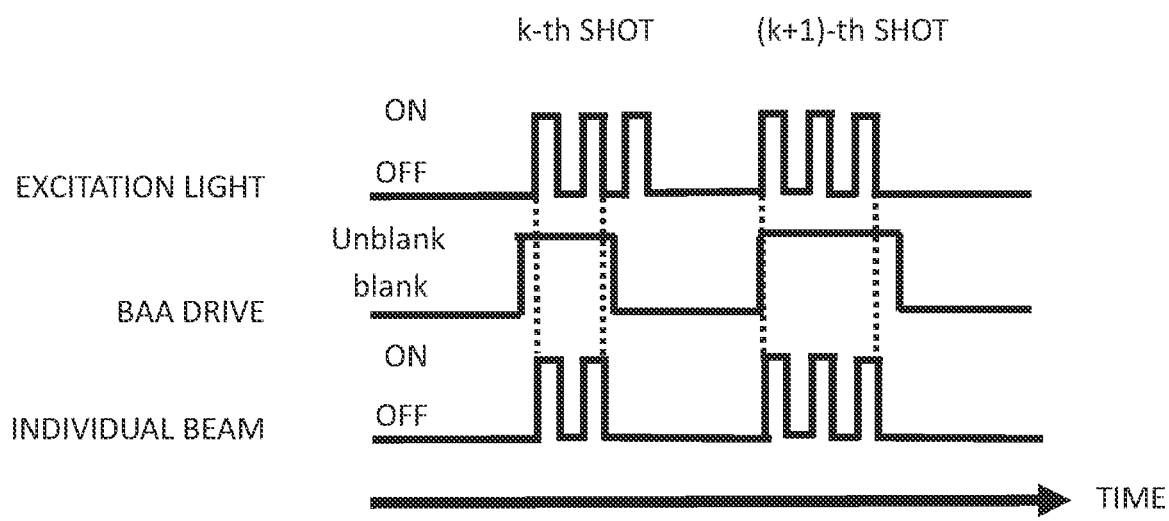
FIG. 10 is a time chart showing an example of a timing of switching between emission and stop of an excitation light, and a timing of switching between ON and OFF of a beam according to a modified example 1 of the first embodiment.

FIG. 10 is a time chart, according to a modified example 1 of the first embodiment, showing an example of a timing of switching between emission and stop of an excitation light, and a timing of switching between ON and OFF of a beam. FIG. 10 shows, similarly to FIG. 9, a timing chart of ON/OFF indicating emission/stop of an excitation light, a timing chart of an ON/OFF drive in individual blanking controlling of a beam in the blanking aperture array mechanism 204, and a timing chart of ON/OFF of a beam associated with an individual blanking control. FIG. 10 shows the k-th shot and the (k+1)-th shot of the multiple photoelectron beams 20.

In FIG. 10, for each shot of the multiple photoelectron beams 20, the control circuit system 160 generates a pulse of the excitation light 200 a predetermined number of times after each excitation light 200 has been in a stop state. Moreover, for each shot of the multiple photoelectron beams 20, the control circuit system 160 provides a control to switch each beam, which is due to be ON, to a "beam ON" state from a "beam OFF" state at a timing of "pulse OFF" between pulses before, at the same time, or after generation of a pulse of each excitation light 200. Then, the control circuit system 160 controls the blanking aperture array mechanism 204 to switch each beam having been controlled in the "beam ON" state to be in a "beam OFF" state after pulses corresponding to an individually required dose are generated. Each pulse of the excitation light 200 individually comprises a gray scale pulse with a width corresponding to the time for one gray scale level for controlling the dose, and the individually required dose of each beam is controlled using the sum of gray scale pulses. The pulse of each excitation light 200 is generated, for example, at a predetermined timing and a predetermined pitch. The time width and pitch of a pulse is set such that the irradiation time of an individual beam can be controlled. When the maximum irradiation time Ttr is defined by, for example, 1023 gray scale levels of gradation, the emission time of one pulse is defined by, for example, the time for one gray scale level. In such a case, the individual blanking control mechanism of each beam in the blanking aperture array mechanism 204 switches each beam which is due to be ON to a "beam ON" state from a "beam OFF" state at a shot cycle start timing. Meanwhile, the light source array 201 starts emitting each excitation light 200 at or after the time of shot cycle starting. The individual blanking control mechanism of each beam switches a beam to a "beam OFF" state from the "beam ON" state after pulses corresponding to an irradiation time individually set are generated. The light source array 201 is stopped after pulses corresponding to an irradiation time greater than or equal to the maximum irradiation time Ttr are generated.

However, it is not limited to what is described above. The pulse width and pitch of the excitation light 200 may be set variably.

Figure 11:
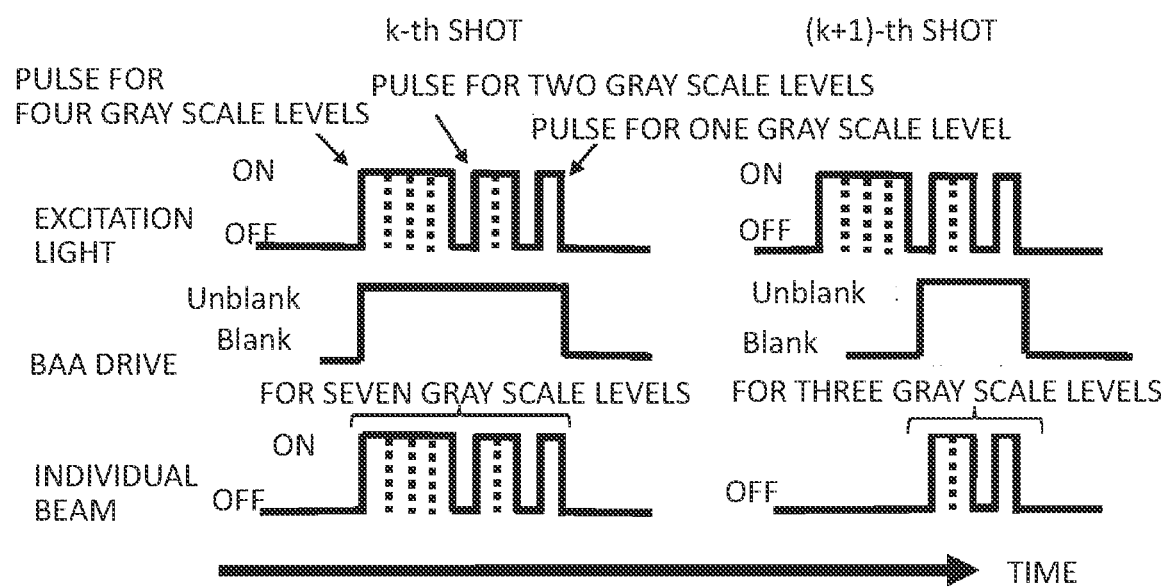
FIG. 11 is a time chart showing another example of a timing of switching between emission and stop of an excitation light, and a timing of switching between ON and OFF of a beam according to the modified example 1 of the first embodiment.

FIG. 11 is a time chart, according to the modified example 1 of the first embodiment, showing another example of a timing of switching between emission and stop of an excitation light, and a timing of switching between ON and OFF of a beam. In FIG. 11, when the maximum irradiation time Ttr is defined by, for example, 8 gray scale levels, pulses are generated as follows: The time of 1 gray scale level generates one pulse, and the time of 7 gray scale levels generates pulses having time widths of once, twice, and four times the one pulse time width. The time of 0 (zero) gray scale level may be an appropriate timing when the excitation light is stopped, or may be controlled as a pulse having a time width of 0 (zero) times the one pulse time width. In such a case, the individual blanking control mechanism of each beam in the blanking aperture array mechanism 204 provides a control to switch a beam to be a "beam ON" state from a "beam OFF" state at a timing of "pulse OFF" between pulses after starting generating pulses of the excitation light 200 within a time period for generating pulses of the excitation light 200. Then, the individual blanking control mechanism of each beam provides a control to switch a beam to a "beam OFF" state from the "beam ON" state, at the timing of having received pulses corresponding to an individually required dose. The example of FIG. 11 shows a combination of pulses at each shot, and a timing of switching between ON and OFF with respect to a beam shot of irradiation time periods of three gray scale levels and a beam shot of irradiation time periods of seven gray scale levels.

Figure 12:
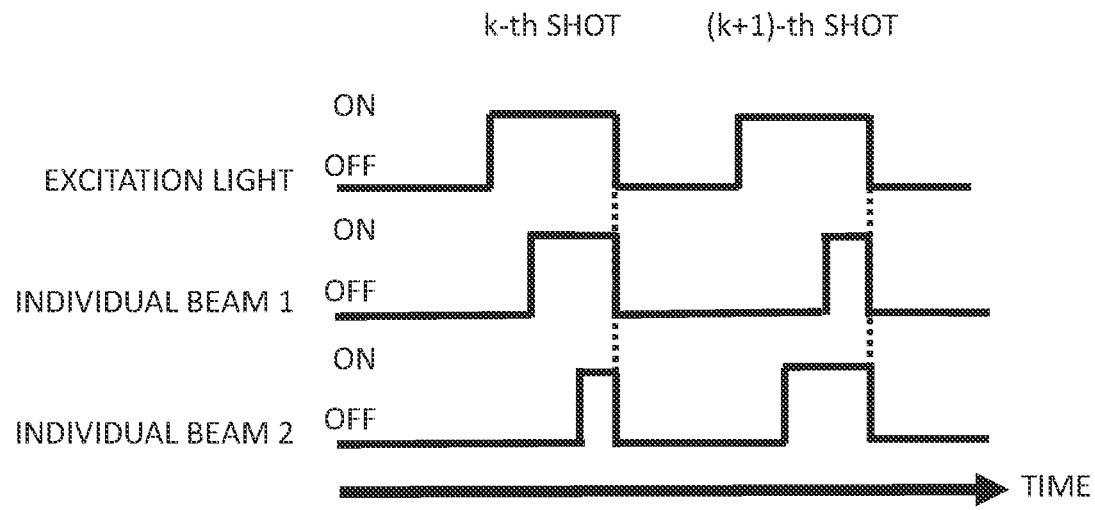
FIG. 12 is a time chart showing another example of a timing of switching between emission and stop of an excitation light, and a timing of switching between ON and OFF of a beam according to a modified example 2 of the first embodiment.

FIG. 12 is a time chart, according to a modified example 2 of the first embodiment, showing another example of a timing of switching between emission and stop of an excitation light, and a timing of switching between ON and OFF of a beam. With respect to the control contents shown in FIG. 9, the case where the timing of switching to a "beam OFF" state is in accordance with the timing of stopping the excitation light 200 is shown in FIG. 12.

In FIG. 12, for each shot of the multiple photoelectron beams 20, the control circuit system 160 generates the excitation light 200 during a predetermined period by switching the excitation light 200 to be in an emission state from a stop state, and while the excitation light 200 is in the emission state, provides a control to switch each beam which is due to be ON to a "beam ON" state from a "beam OFF" state. Then, the control circuit system 160 provides a control to switch the excitation light 200 to be in a stop state from the emission state, in synchronization with the timing of switching each beam having been controlled to be ON to a "beam OFF" state from the "beam ON" state. Specifically, the individual blanking control mechanism of each beam in the blanking aperture array mechanism 204 acquires, by an inverse calculation, a start timing of an irradiation time individually set, based on a stop timing of the excitation light 200, and switches, at the acquired start timing, each beam which is due to be ON to a "beam ON" state from a "beam OFF" state. Meanwhile, the light source array 201 starts emitting the excitation light 200 at the same time as the first start timing to be "beam ON" of each beam, or at the shot cycle start timing which is set before the first start timing to be "beam ON" of each beam. Then, the light source array 201 stops emitting (generating) the excitation light 200 after a predetermined time has passed since the shot cycle start timing. The individual blanking control mechanism of each beam switches a beam to be a "beam OFF" state from a "beam ON" state in accordance with the stop timing of the excitation light 200. Therefore, each beam becomes in a state of "beam OFF" at the stop timing of the excitation light 200 in accordance with the operation of the individual blanking control mechanism. In the case of making a beam be OFF by blanking deflection, it may take time for the beam to fall. Because of using a laser oscillator, the light source array 201 has a higher switching responsiveness to ON/OFF of the excitation light 200 than that of the individual blanking control mechanism. Therefore, it is possible not to generate leaking beams during a beam fall by synchronizing the stop timing of the excitation light 200 with the beam OFF timing.

Figure 13:
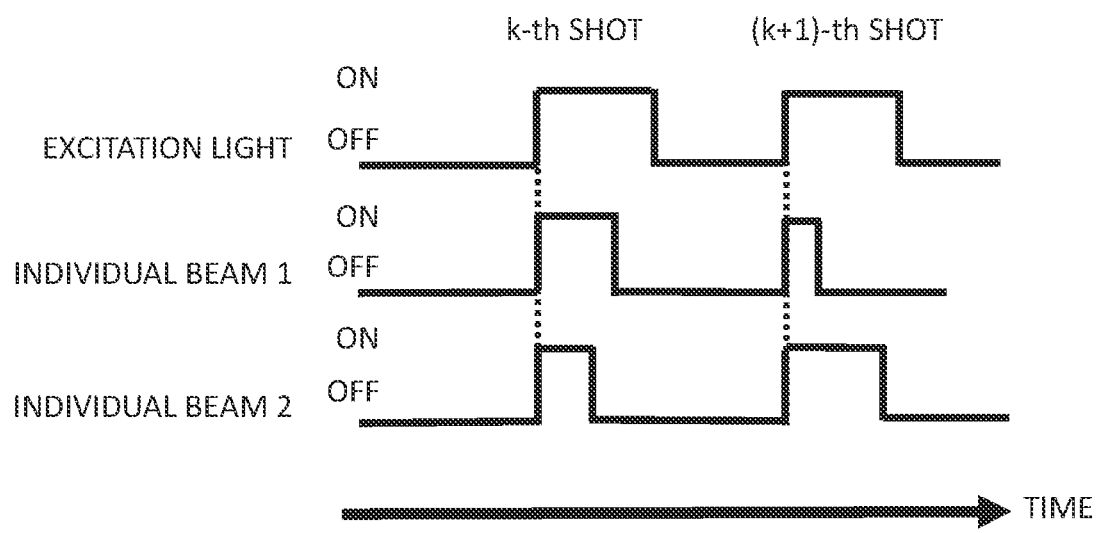
FIG. 13 is a time chart showing another example of a timing of switching between emission and stop of an excitation light, and a timing of switching between ON and OFF of a beam according to a modified example 3 of the first embodiment.

FIG. 13 is a time chart, according to a modified example 3 of the first embodiment, showing another example of a timing of switching between emission and stop of an excitation light, and a timing of switching between ON and OFF of a beam. With respect to the control contents shown in FIG. 9, the case where the timing of switching to a "beam ON" state (that is, an irradiation start timing) is in accordance with the timing of emitting the excitation light 200 is shown in FIG. 13.

In FIG. 13, for each shot of the multiple photoelectron beams 20, the control circuit system 160 provides a control to switch each beam which is due to be ON to a "beam ON" state from a "beam OFF" state, in synchronization with the timing of switching the excitation light 200 from a stop state to an emission state. Then, the control circuit system 160 provides a control to switch each beam having been controlled to be ON to a "beam OFF" state from the "beam ON" state before switching the excitation light 200 to a stop state from the emission state. Specifically, at the start timing of the shot cycle, the individual blanking control mechanism of each beam in the blanking aperture array mechanism 204 switches each beam which is due to be ON to be in a "beam ON" state from a "beam OFF" state. In the case of making a beam be ON by blanking deflection, it may take time for the beam to rise. Because of using a laser oscillator, the light source array 201 has a higher switching responsiveness to ON/OFF of the excitation light 200 than that of the individual blanking control mechanism. Therefore, the light source array 201 starts emitting the excitation light 200, in accordance with the timing at which a beam rise time has passed since the shot cycle start timing. Therefore, each beam becomes in a "beam ON" state at the timing of starting emission of the excitation light 200. The individual blanking control mechanism of each beam switches a beam to a "beam OFF" state from a "beam ON" state after an irradiation time individually set has passed. The light source array 201 stops emitting the excitation light 200 after a predetermined time greater than or equal to the maximum irradiation time Ttr has passed since the shot cycle start timing. Therefore, it is possible not to generate leaking beams during a beam rise by synchronizing the start timing of emission of the excitation light 200 with the beam ON timing. Moreover, since it is possible to avoid the dose during the beam rise, the accuracy of the dose amount can be increased.

As described above, according to the first embodiment, for each shot of the multiple photoelectron beams 20, an individual blanking control which individually switches each beam between ON and OFF is performed by deflecting each beam of the multiple photoelectron beams 20, using the blanking aperture array mechanism 204, while interlocking the timing of switching the excitation light 200 between emission and stop with the timing of switching each beam between ON and OFF.

The writing mechanism 150 writes a pattern on the target object 101, using multiple photoelectron beams having been controlled to be "beam ON".

As described above, according to the first embodiment, it is possible in multi-beam writing to reduce a difference among received light amounts of respective regions (respective electron emission positions) of the photoemissive surface 218 generating electron beams, thereby increasing the uniformity (equality).

Second Embodiment

Although the first embodiment describes the configuration in which a plurality of excitation lights 50 from the light source array 201 are arrayed in a square lattice at the incident surface of the multi-lens array 212, it is not limited thereto. The configuration of the writing apparatus 100 is the same as that of FIG. 1.

Figure 14:
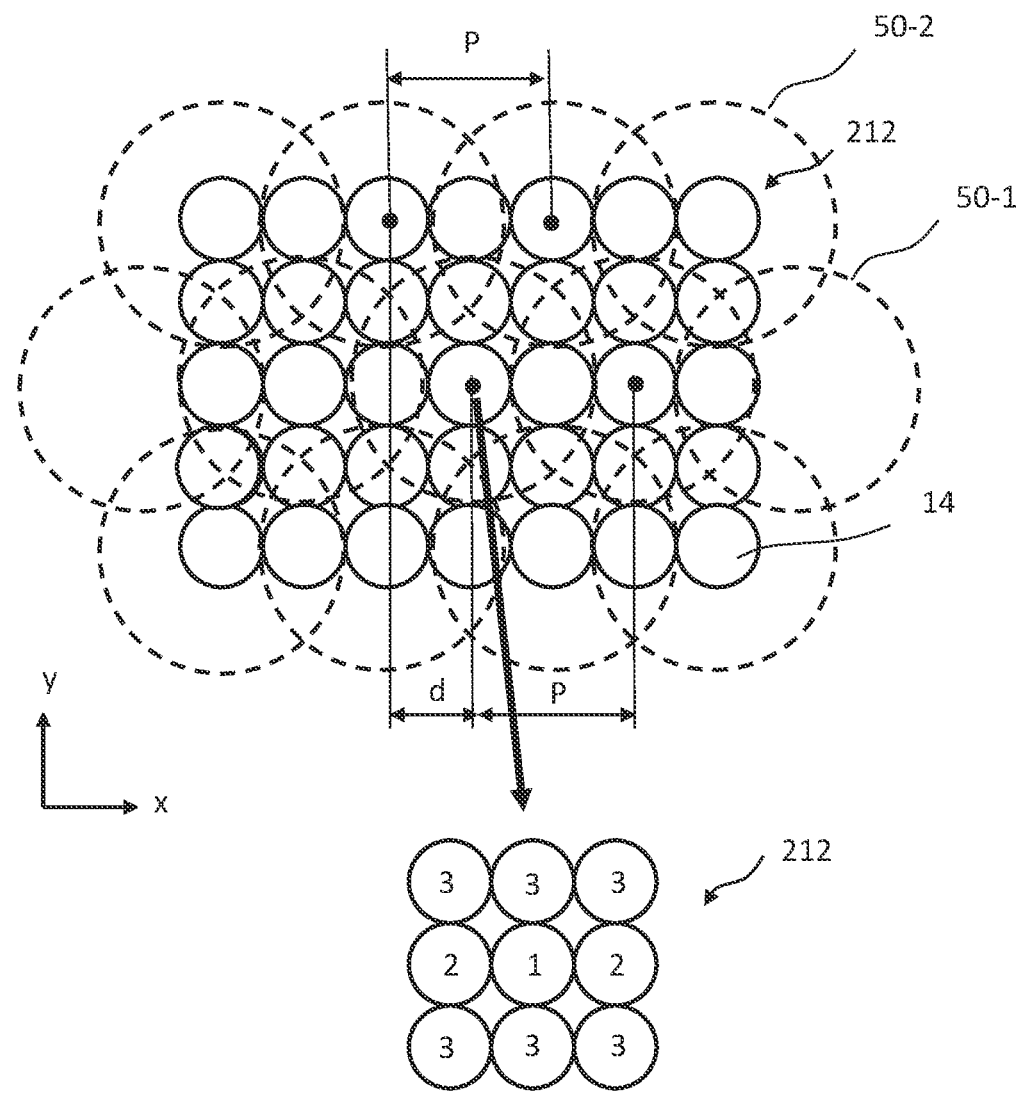
FIG. 14 is an illustration showing an example of irradiation positions of a plurality of excitation lights irradiating a multi-lens array according to a second embodiment.

FIG. 14 is an illustration showing an example of irradiation positions of a plurality of excitation lights irradiating a multi-lens array according to a second embodiment. The example of FIG. 14 shows 7×5 ones of a plurality of individual lenses 14 configuring the multi-lens array 212. The plurality of individual lenses 14 are arranged in an array. In the example of FIG. 14, a plurality of excitation lights 50 are arrayed in a houndstooth pattern, which can be obtained, for example, by arranging respective light sources of the light source array 201 in a houndstooth pattern. In other words, with respect to the rows adjacent in the y direction, the center position of the excitation light 50 is arranged at a pitch P to be shifted in the x direction by a distance d. For example, the distance d is preferably the arrangement pitch of the individual lens 14. In further other words, the row in which the center position of the excitation light 50 is arranged at the pitch P in the x direction, and the row in which the center position of the excitation light 50 is arranged to be shifted in the x direction by one individual lens 14 at the pitch P are alternately arranged in the y direction. Thus, it is also preferable that the multi-lens array 212 is irradiated with a plurality of excitation lights 50 while shifting the position.

In the example of FIG. 14, similarly to FIG. 2, each of the plurality of excitation lights 50 from the light source array 201 individually illuminates a corresponding lens set of a plurality of lens sets each of which are composed of a plurality of individual lenses 14 being a portion of the plurality of individual lenses 14 configuring the multi-lens array 212.

In the example of FIG. 14, the plurality of excitation lights 50 irradiates the multi-lens array 212, for example, at a pitch P being twice the arrangement pitch d between individual lenses 14. Each excitation light 50 irradiates a plurality of individual lenses 14, centering on the individual lens 14 being the center of 3×3 individual lenses 14, for example. FIG. 14 shows the case where, within the spot diameter of each excitation light 50, there are included the whole of the center individual lens 14 (lens 1), the whole of two individual lenses 14 (lens 2) adjacent in the x and −x directions to the central individual lens 14, the whole of two individual lenses 14 (lens 3) adjacent in the y and −y directions to the central individual lens 14, and a part of four individual lenses 14 (lens 3) oblique to the central individual lens 14. As shown in FIG. 3, since the individual lens 14 (lens 1) located at the center of the irradiation position of each excitation light 50 is irradiated with the maximum intensity light, its received light amount is large. In contrast, the intensity of an excitation light irradiating peripheral individual lenses 14 is low compared with that at the center. Therefore, the illumination intensity of peripheral individual lenses 14 received from one excitation light is small.

Thus, according to the second embodiment, each of peripheral individual lenses 14 is irradiated with two or more excitation lights 50. In the case of FIG. 14, each of the two individual lenses 14 (lens 2) adjacent in the x and −x directions to the central individual lens 14 (lens 1) is ovelappingly irradiated with two excitation lights. Each of the two individual lenses 14 (lens 3) adjacent in the y and −y directions and the four individual lenses 14 (lens 3) oblique to the central individual lens is overlappingly irradiated with three excitation lights. The whole of the two individual lenses 14 (lens 2) adjacent in the x and −x directions to the central individual lens is irradiated with excitation lights each having a low illumination intensity. Therefore, by being irradiated with two excitation lights each having a low illumination intensity, the illumination intensity of the two individual lenses 14 adjacent in the x and −x directions can be substantially the same as or close to the received light amount of the center individual lens 14 (lens 1). With respect to the two individual lenses 14 (lens 3) adjacent in the y and −y directions and the four individual lenses 14 (lens 3) in the oblique directions to the central individual lens 14, since only a portion of them is included in the spot diameter of each excitation light 50, the illumination intensity of them can be substantially the same as or close to the received light amount of the center individual lens 14 (lens 1) by being irradiated with three excitation lights. Although the overlapping manner in the example of FIG. 14 differs from that of the example of FIG. 2, the difference among received light amounts of respective individual lenses 14 can be reduced even in FIG. 14.

The other contents of the second embodiment are the same as those of the first embodiment.

Third Embodiment

Although, in the first and second embodiments described above, the multi-lens array 212 is composed of a plurality of individual lenses 14 of the same size, it is not limited thereto. A third embodiment describes the case where the multi-lens array 212 is composed of a plurality of individual lenses 14 of different sizes. The configuration of the writing apparatus 100 is the same as that of FIG. 1.

Figure 15:
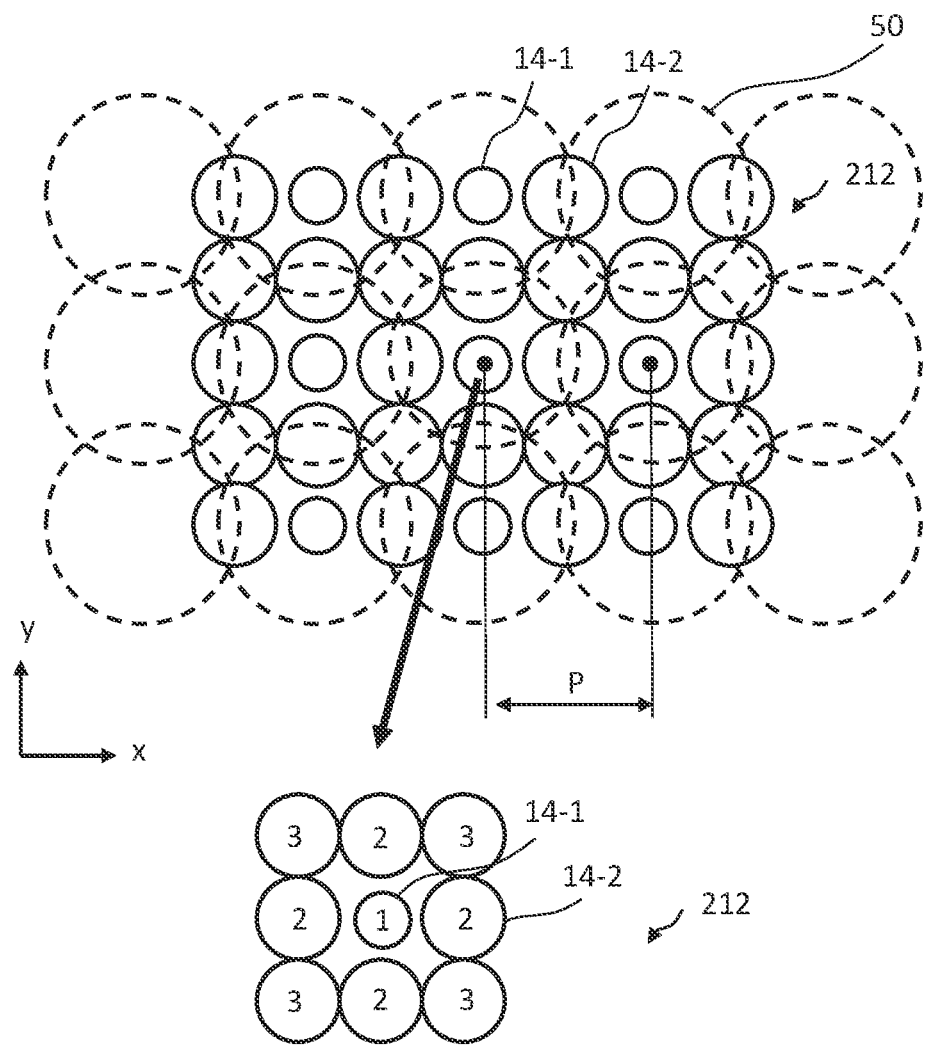
FIG. 15 is an illustration showing an example of irradiation positions of a plurality of excitation lights irradiating a multi-lens array according to a third embodiment.

FIG. 15 is an illustration showing an example of irradiation positions of a plurality of excitation lights irradiating a multi-lens array according to the third embodiment. The example of FIG. 15 shows 7×5 ones of a plurality of individual lenses 14 configuring the multi-lens array 212. The plurality of individual lenses 14 are arranged in an array. The plurality of individual lenses 14 includes individual lenses 14-1 and 14-2 of different sizes. In the example of FIG. 15, two large and small individual lenses 14-1 and 14-2 are used. FIG. 15 shows the case where, at the upper surface of the multi-lens array 212, a plurality of excitation lights 50 are arranged in a square lattice array. In that case, as the individual lens to be irradiated with the center portion of the excitation light 50, the small individual lens 14-1 is used. As the individual lenses to be irradiated with peripheral excitation lights 50, the large individual lenses 14-2 are used.

In the example of FIG. 15, similarly to FIG. 2, each of the plurality of excitation lights 50 from the light source array 201 individually illuminates a plurality of individual lenses 14-1 and 14-2 of a plurality of individual lenses 14 configuring the multi-lens array 212. Further, in the plurality of individual lenses 14 configuring the multi-lens array 212, the large individual lenses 14-2 are irradiated with two or more excitation lights 50.

In the example of FIG. 15, the plurality of excitation lights 50 irradiates the multi-lens array 212, for example, at a pitch P being twice the arrangement pitch d between individual lenses 14. Each excitation light 50 irradiates a plurality of individual lenses 14, centering on the individual lens 14 being the center of 3×3 individual lenses 14, for example. FIG. 15 shows the case where, within the spot diameter of each excitation light 50, there are included the whole of the center individual lens 14-1, and some parts of eight individual lenses 14-2 being peripheral of the central individual lens 14-1.

In the case of FIG. 15, each of the four individual lenses 14-2 (lens 2) adjacent in the x and −x directions and the y and −y directions to the central individual lens 14-1 (lens 1) is irradiated with two excitation lights. Each of the four individual lenses 14-3 (lens 3) in the oblique directions is irradiated with four excitation lights.

Since the individual lens 14-1 located at the center of the irradiation position of each excitation light 50 is irradiated with the light having the maximum intensity as shown in FIG. 3, the number of incident light fluxes can be limited by reducing the lens size. Accordingly, the received light amount of the individual lens 14-1 located at the center can be reduced. In contrast, the intensities of excitation lights applied to peripheral individual lenses 14-2 are lower than that applied to the center. Therefore, the received light amount of each of the peripheral individual lenses 14-2 irradiated with one excitation light is small. The number of incident light fluxes can be increased by increasing the lens size. Further, light fluxes from a plurality of excitation lights 50 are incident on the peripheral individual lens 14-2 by increasing the lens size. The irradiation area per excitation light of the four individual lenses 14-2 (lens 3) in the oblique directions is smaller than that of the four individual lenses 14-2 (lens 2) adjacent in the x and −x directions and the y and −y directions. Thus, by increasing the number of excitation lights irradiating the four individual lenses 14-2 (lens 3) in the oblique directions to be larger than that irradiating the four individual lenses 14-2 (lens 2) adjacent in the x and −x directions and the y and −y directions, it becomes possible to adjust the illumination intensity. Accordingly, variation in the illumination intensities of respective individual lenses 14 can be reduced.

Figure 16:
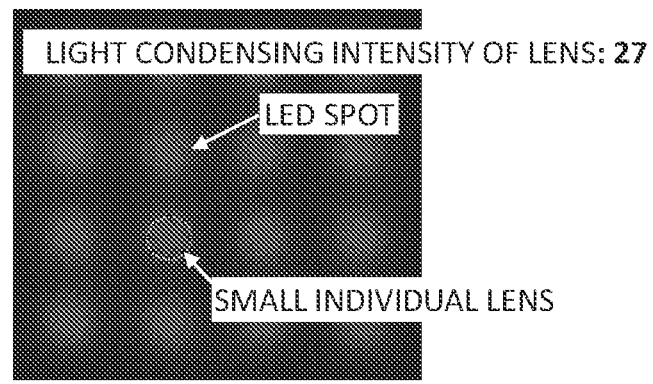
FIG. 16 is a top view of an arrangement example of a small individual lens according to the third embodiment.

FIG. 16 is a top view of an arrangement example of a small individual lens according to the third embodiment, where a distribution of the illumination intensity at the time of the excitation light 50 irradiating the multi-lens array 212 is shown.

Figure 17:
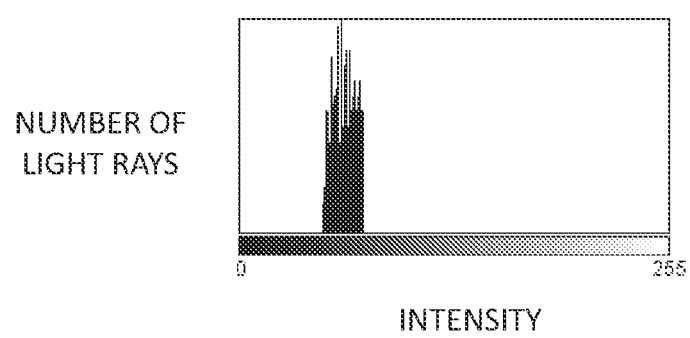
FIG. 17 is a diagram showing an example of a histogram of a light incident on a small individual lens according to the third embodiment.

FIG. 17 is a diagram showing an example of a histogram of a light incident on a small individual lens according to the third embodiment. The example of FIG. 16 shows the case where the small individual lens 14-1 is arranged in the center of a spot of the excitation light 50. In that case, it turns out that multiple light fluxes whose intensities exist in a narrow range are incident on the lens as shown in FIG. 17. In that case, the integrated value of the histogram of the received light amount (lens condensing intensity) of the individual lens 14-1 is 27 (the unit is A.U.).

Figure 18:
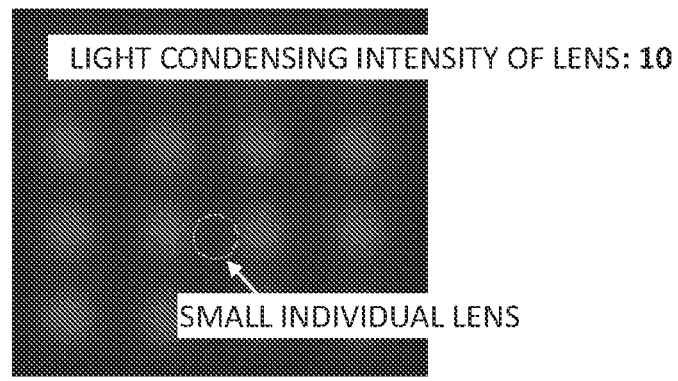
FIG. 18 is a top view of another arrangement example of a small individual lens according to a comparative example of the third embodiment.
Figure 19:
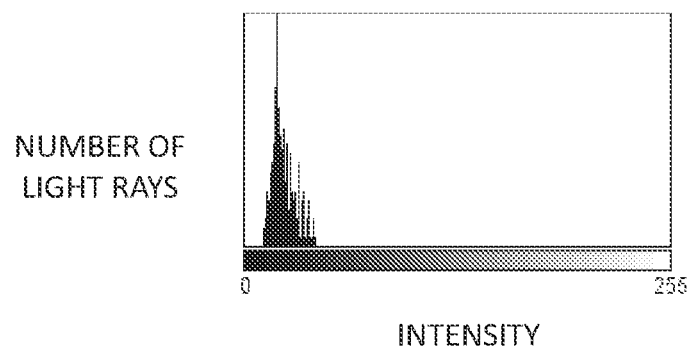
FIG. 19 is a diagram showing another example of a histogram of a light incident on a small individual lens according to the comparative example of the third embodiment.

FIG. 18 is a top view of another arrangement example of a small individual lens according to a comparative example of the third embodiment, where a distribution of the illumination intensity at the time of the excitation light 50 irradiating the multi-lens array 212 is shown. FIG. 19 is a diagram showing another example of a histogram of a light incident on a small individual lens according to the comparative example of the third embodiment. The example of FIG. 18 shows the case where the small individual lens 14-1 is arranged between spots of two excitation lights 50. In that case as shown in FIG. 19, compared with FIG. 17, it turns out that the width of intensities of incident lights is not largely changed, but intensities whose number of light rays is low are shifting to the lower intensity side. In that case, the received light amount (lens condensing intensity) of the individual lens 14-1 is 10 (the unit is A.U.).

Figure 20:
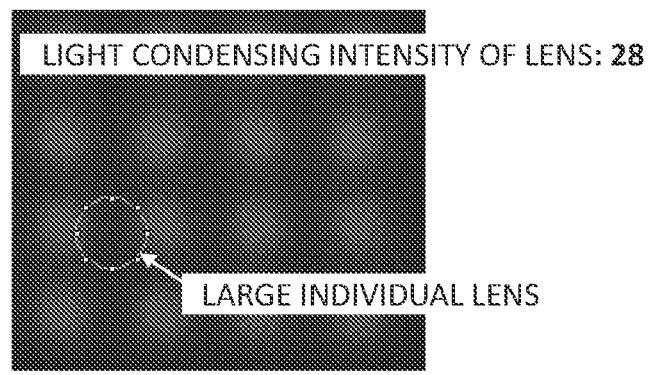
FIG. 20 is a top view of another arrangement example of a large individual lens according to the third embodiment.
Figure 21:
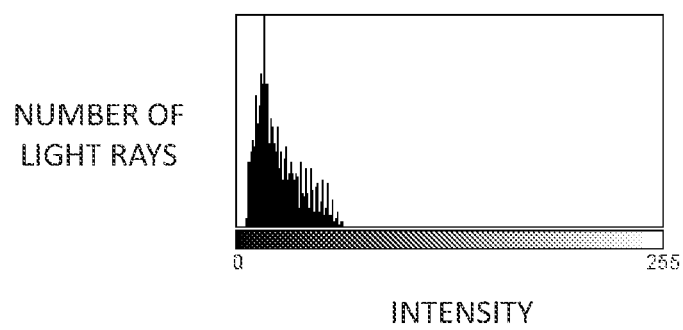
FIG. 21 is a diagram showing another example of a histogram of a light incident on a large individual lens according to the third embodiment.

FIG. 20 is a top view of another arrangement example of a large individual lens according to the third embodiment, where a distribution of the illumination intensity at the time of the excitation light 50 irradiating the multi-lens array 212 is shown. FIG. 21 is a diagram showing another example of a histogram of a light incident on a large individual lens according to the third embodiment. The example of FIG. 20 shows the case where the large individual lens 14-2 is arranged between spots of two excitation lights 50. In that case as shown in FIG. 21, compared with FIG. 17, it turns out that intensities whose number of light rays is low are shifting to the lower intensity side, and the width of intensities of incident lights is increased. Therefore, it turns out that numerous light fluxes whose intensities are low are incident. In that case, the received light amount (lens condensing intensity) of the individual lens 14-2 is 28 (the unit is A.U.). Therefore, it is possible to obtain the received light amount equivalent to that in the case where the small individual lens 14-1 is arranged in the center of the spot of the excitation light 50 as shown in FIG. 16 and FIG. 17.

As indicated by the above results, variation in the illumination intensities of respective individual lenses 14 can be reduced by arranging the small individual lens 14-1 in the center of the spot of the excitation light 50, and the large individual lens 14-2 between spots of respective excitation lights 50.

In the examples described above, the multi-lens array 212 is configured by combination of two lens sizes, but it is not limited thereto.

Figure 22:
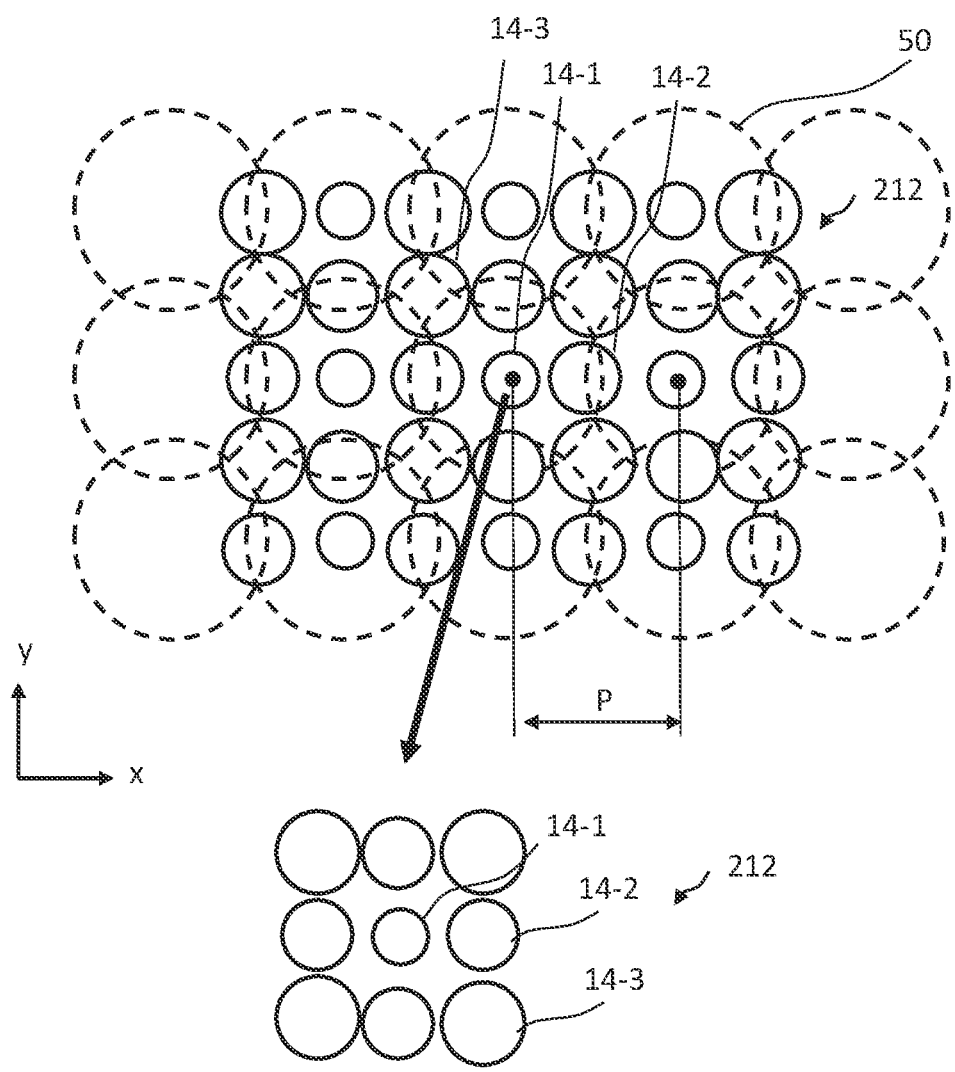
FIG. 22 is an illustration showing an example of irradiation positions of a plurality of excitation lights irradiating a multi-lens array according to a modified example of the third embodiment.

FIG. 22 is an illustration showing an example of irradiation positions of a plurality of excitation lights irradiating a multi-lens array according to a modified example of the third embodiment. The example of FIG. 22 shows 7×5 ones of a plurality of individual lenses 14 configuring the multi-lens array 212. The plurality of individual lenses 14 are arranged in an array. The plurality of individual lenses 14 includes individual lenses 14-1, 14-2, and 14-3. In the example of FIG. 22, individual lenses 14-1, 14-2, and 14-3 of three sizes of large, medium, and small are used. FIG. 22 shows the case where, at the upper surface of the multi-lens array 212, a plurality of excitation lights 50 are arranged in a square lattice array. In that case, as the individual lens to be irradiated with the center portion of the excitation light 50, the small-sized individual lens 14-1 is used. As the four individual lenses adjacent in the x and −x directions and the y and −y directions to the central individual lens 14-1, the medium-sized individual lens 14-2 is used. As the four individual lenses oblique to the central individual lens 14-1, the large-sized individual lens 14-3 is used.

In the example of FIG. 22, the four medium-sized individual lenses 14-2 (lens 2) adjacent in the x and −x directions and the y and −y directions to the central individual lens 14-1 (lens 1) are irradiated with two excitation lights. The four large-sized individual lenses 14-3 (lens 3) in the oblique directions are irradiated with four excitation lights. The illumination intensity of each excitation light incident on the four individual lenses 14-3 (lens 3) in the oblique directions is small. Therefore, by using the large-sized individual lens 14-3 which is larger than the four individual lenses 14-2 (lens 2) adjacent in the x and −x directions and the y and −y directions, the received light amount can be increased. By contrast, the illumination intensity of each incident excitation light of the four individual lenses 14-2 (lens 2) adjacent in the x and −x directions and the y and −y directions is larger than that of the four individual lenses 14-3 (lens 3) in the oblique directions. Therefore, by using the medium-sized individual lens 14-2 which is smaller than the four individual lenses 14-3 (lens 3) in the oblique directions, the received light amount can be reduced. Thus, according to the relation between the arrangement position of an individual lens and the spot position of an excitation light, the received light amount can be further finely adjusted compared with the case of using two lens sizes.

In the examples described above, a plurality of excitation lights 50 are arranged in a square lattice array, but it is also preferable, similarly to FIG. 14, to use a plurality of excitation lights 50 arrayed in a houndstooth pattern.

The other contents are the same as those of the first embodiment.

Fourth Embodiment

In each of the embodiments described above, the whole of a plurality of excitation lights from the light source array 201 is incident on the same illumination lens, but it is not limited thereto. A fourth embodiment describes a configuration of using a multi-lens array for an illumination lens. Hereinafter, the contents of the fourth embodiment are the same as those of any one of the first to third embodiments except for what is particularly described below.

Figure 23:
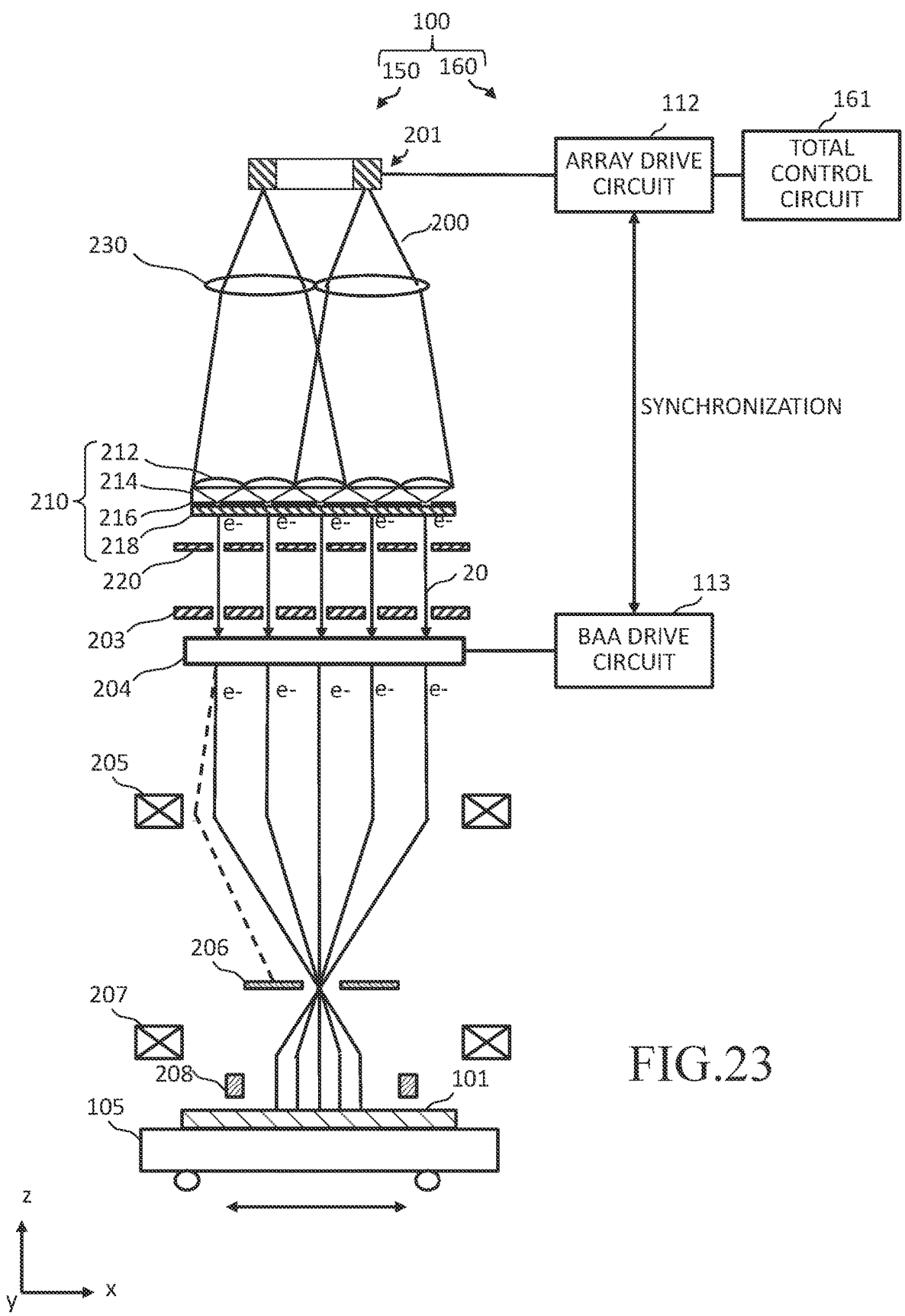
FIG. 23 is a conceptual diagram showing a configuration of a writing apparatus according to a fourth embodiment.

FIG. 23 is a conceptual diagram showing a configuration of a writing apparatus according to the fourth embodiment. FIG. 23 is the same as FIG. 1 except that an illumination multi-lens array 230 is arranged instead of the illumination lens 202. The illumination multi-lens array 230 (second multi-lens array) is arranged between the light source array 201 and the multi-lens array 212 (first multi-lens array).

In the configuration where the whole of a plurality of excitation lights from the light source array 201 is incident on the same illumination lens 202, since the angle of the excitation light 50 incident on the multi-lens array 212 differs between the excitation light passing through the central part of the illumination lens 202, and the excitation light passing through the peripheral part, unevenness may occur in the illumination intensity on the multi-lens array 212. In order to apply a plurality of excitation lights as uniform as possible to the multi-lens array 212, it is desirable that each excitation light passes through the lens at the angle as same as possible. For this purpose, it is desirable to make each excitation light pass through the individual lens.

In the fourth embodiment, the illumination multi-lens array 230 where the individual lens is arranged for each excitation light is used. The number of a plurality of illumination individual lenses 13 which configure the illumination multi-lens array 230 may be the same, larger, or smaller than that of a plurality of light sources 11 which configure the light source array 201. When the number of the light sources 11 is the same as that of the illumination individual lenses 13, each individual lens is arranged such that the line connecting a paired center of the light source 11 and center of the illumination individual lens 13 is arranged to be in accordance with the trajectory center of an excitation light output from the light source. A plurality of individual lenses configuring the illumination multi-lens array 230 are arranged not being overlapped with each other.

By this configuration, the unevenness of a plurality of excitation lights 50 applied on the multi-lens array 212 can be eliminated or reduced. Therefore, it is possible to make the state of the plurality of excitation lights 50 close to uniformly.

Figure 24:
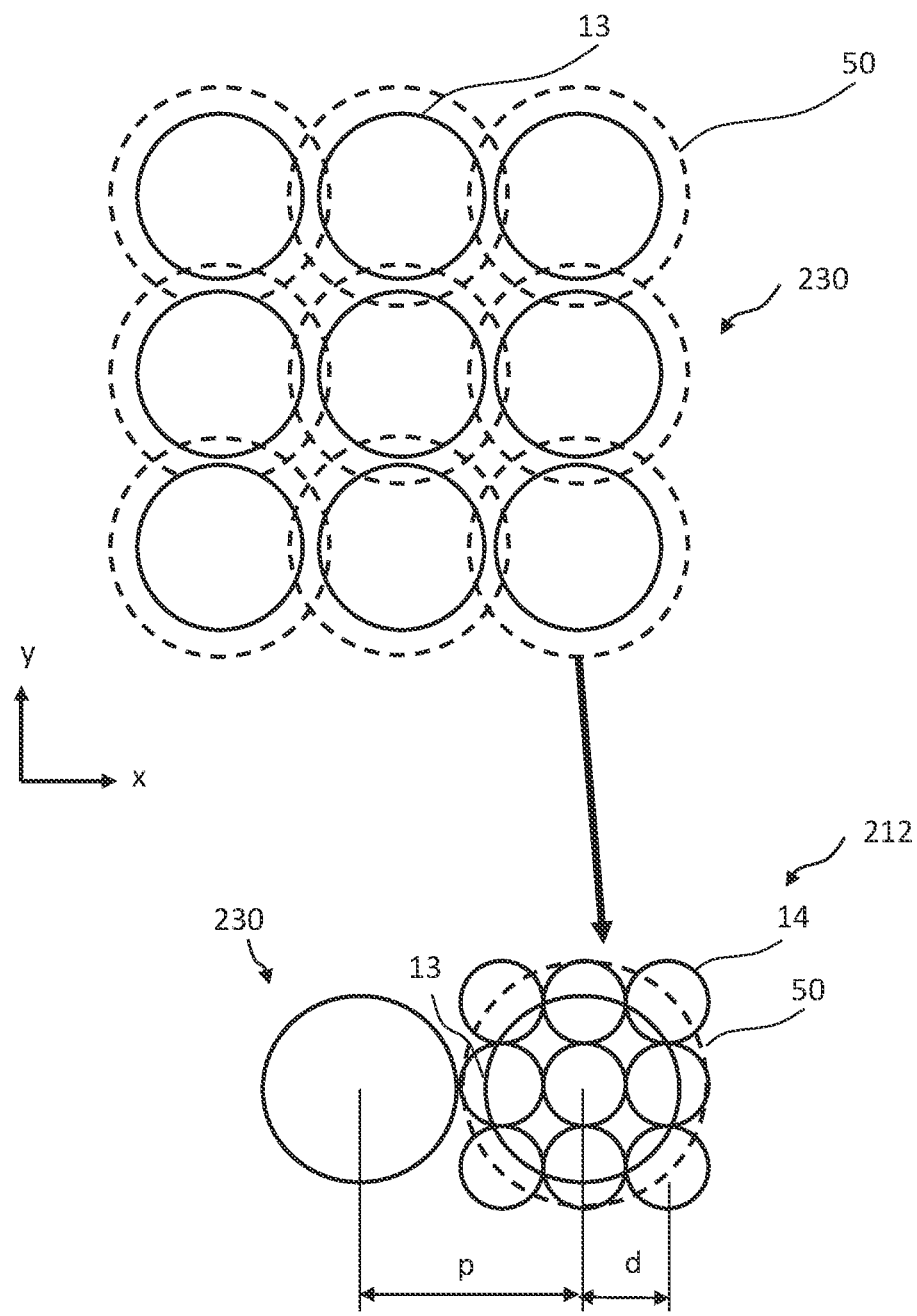
FIG. 24 is an illustration showing an example of spot diameters of a plurality of excitation lights according to the fourth embodiment.

FIG. 24 is an illustration showing an example of spot diameters of a plurality of excitation lights according to the fourth embodiment. A plurality of excitation lights 200 emitted from the light source array 201 illuminates the illumination multi-lens array 230, while spreading with a predetermined spot diameter. The example of FIG. 24 shows a plurality of excitation lights 50 each with a spot diameter on the illumination multi-lens array 230. Further, specifically, a plurality of excitation light 50 illuminates the multi-lens array 212 while being refracted by each illumination individual lens 13 of the illumination multi-lens array 230. The detailed example of FIG. 24 shows an example of spot diameters of a plurality of excitation lights 50 on the multi-lens array 212. In the case of FIG. 24, the plurality of excitation lights 50 illuminates the multi-lens array 212 while further spreading with being refracted by each individual lens of the illumination multi-lens array 230, for example. The illumination state of the plurality of excitation lights 50 on the multi-lens array 212 is such a state where each individual lens 14 on the multi-lens array 212 is irradiated as shown in the example of FIG. 2. Therefore, the pitch of the arrayed individual lens differs between the multi-lens array 212 (the first multi-lens array) and the illumination multi-lens array 230 (the second multi-lens array). With respect to the illumination multi-lens array 230, a plurality of illumination individual lenses 13 are arranged at an arrangement pitch p larger than the arrangement pitch d of the plurality of individual lenses 14 of the multi-lens array 212.

In the examples described above, a plurality of excitation lights 50 are arranged in a square lattice array, but it is also preferable, similarly to FIG. 14, to use a plurality of excitation lights 50 arrayed in a houndstooth pattern. In that case, a plurality of light sources 11 configuring the light source array 201 and a plurality of individual lenses configuring the illumination multi-lens array 230 are also arranged in a houndstooth pattern.

In the examples described above, although the multi-lens array 212 is irradiated with one illumination multi-lens array 230 as the second multi-lens array, it is also preferable, by further adding an illumination multi-lens array, to use a plurality of illumination multi-lens arrays.

The other contents are the same as those of the first embodiment.

Embodiments have been explained referring to specific examples described above. However, the present invention is not limited to these specific examples.

While the case of inputting a 10-bit control signal for controlling each logic circuit 41 has been described above, the number of bits may be suitably set. For example, a 2-bit (or any one of 3 to 9 bit) control signal may be used. Alternatively, a control signal of 11 bits or more may be used.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

In addition, any multi-charged particle beam writing apparatus and multi-charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-electron beam writing apparatus comprising:
a light source array configured to include a plurality of light sources and generate a plurality of first lights;
a multi-lens array configured to include a plurality of first lenses, and to divide the plurality of first lights into a plurality of second lights by that each of the plurality of first lights illuminates a corresponding lens set of a plurality of lens sets each of which are composed of a plurality of second lenses being a portion of the plurality of first lenses and by that each of lenses, which are at least a part of the plurality of second lenses, is irradiated with two or more first lights of the plurality of first lights;
a photoemissive surface configured to receive the plurality of second lights through its upper surface, and emit multiple photoelectron beams from its back surface;

a blanking aperture array mechanism configured to perform an individual blanking control by individually switching between ON and OFF of each of the multiple photoelectron beams; and an electron optical system configured to irradiate a target object with the multiple photoelectron beams.

2. The apparatus according to claim 1, wherein the plurality of first lenses includes lenses of a plurality of sizes.

3. The apparatus according to claim 1, wherein the multi-lens array is used as a first multi-lens array, further comprising:

a second multi-lens array between the light source array and the first multi-lens array.

4. The apparatus according to claim 3, wherein a lens array pitch of the first multi-lens array is different from a lens array pitch of the second multi-lens array.

5. The apparatus according to claim 1, further comprising:

a control circuit configured to interlock, for each shot of the multiple photoelectron beams, a timing of switching between emission and stop of the plurality of first lights with a timing of switching between ON and OFF of each beam.

6. The apparatus according to claim 1, wherein the plurality of first lights illuminates the multi-lens array such that first lights adjacent to each other are partially overlapped with each other.

7. The apparatus according to claim 1, wherein the multi-lens array divides the plurality of first lights into a plurality of second lights whose number is different from that of the plurality of first lights.

8. The apparatus according to claim 7, wherein the multi-lens array divides the plurality of first lights into the plurality of second lights whose number is greater than that of the plurality of first lights.

9. The apparatus according to claim 1, wherein the plurality of first lights has an intensity distribution in which an intensity is large at a center part and becomes smaller toward an outer peripheral side, and in the plurality of first lenses, each of lenses each of which is to be irradiated with the intensity of the center part is irradiated by one first light, and other lenses are irradiated by two or more first lights.

10. A multi-electron beam writing method comprising:

generating a plurality of first lights from a light source array which includes a plurality of light sources;

dividing, using a multi-lens array which includes a plurality of first lenses, the plurality of first lights into a plurality of second lights by that each of the plurality of first lights illuminates a corresponding lens set of a plurality of lens sets each of which are composed of a plurality of second lenses being a portion of the plurality of first lenses and by that each of lenses, which are at least a part of the plurality of second lenses, is irradiated with two or more first lights of the plurality of first lights;

receiving the plurality of second lights through an upper surface of a photoemissive surface, and emitting multiple photoelectron beams from a back surface of the photoemissive surface;

performing an individual blanking control, using a blanking aperture array mechanism, by individually switching between ON and OFF of each of the multiple photoelectron beams; and writing a pattern on a target object by using the multiple photoelectron beams.

* * * * *